(12) United States Patent
Jo et al.

(10) Patent No.: US 10,079,060 B2
(45) Date of Patent: *Sep. 18, 2018

(54) SENSING A NON-VOLATILE MEMORY DEVICE UTILIZING SELECTOR DEVICE HOLDING CHARACTERISTICS

(71) Applicant: Crossbar, Inc., Santa Clara, CA (US)

(72) Inventors: Sung Hyun Jo, Sunnyvale, CA (US);
Hagop Nazarian, San Jose, CA (US);
Lin Shih Liu, Fremont, CA (US)

(73) Assignee: CROSSBAR, INC., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/495,574

(22) Filed: Apr. 24, 2017

(65) Prior Publication Data
US 2017/0229169 A1    Aug. 10, 2017

Related U.S. Application Data

(63) Continuation of application No. 14/755,998, filed on Jun. 30, 2015, now Pat. No. 9,633,724.
(Continued)

(51) Int. Cl.
*G11C 13/00* (2006.01)
*G11C 14/00* (2006.01)

(52) U.S. Cl.
CPC ........ *G11C 13/004* (2013.01); *G11C 14/0045* (2013.01)

(58) Field of Classification Search
CPC ........................ G11C 13/004; G11C 14/0045
See application file for complete search history.

(56) References Cited

U.S. PATENT DOCUMENTS 6,849,891 B1    2/2005  Hsu et al.
6,855,975 B2    2/2005  Gilton
(Continued)

FOREIGN PATENT DOCUMENTS

CN    1506972 A    6/2004
CN    1961378 A    5/2007
(Continued)

OTHER PUBLICATIONS

Office Action dated Dec. 6, 2013 for U.S. Appl. No. 13/960,735, 19 pages.
(Continued)

*Primary Examiner* — Tri Hoang
(74) *Attorney, Agent, or Firm* — Amin, Turocy & Watson, LLP

(57) ABSTRACT

Providing for improved sensing of non-volatile resistive memory to achieve higher sensing margins, is described herein. The sensing can leverage current-voltage characteristics of a volatile selector device within the resistive memory. A disclosed sensing process can comprise activating the selector device with an activation voltage, and then lowering the activation voltage to a holding voltage at which the selector device deactivates for an off-state memory cell, but remains active for an on-state memory cell. Accordingly, very high on-off ratio characteristics of the selector device can be employed for sensing the resistive memory, providing sensing margins not previously achievable for non-volatile memory.

20 Claims, 10 Drawing Sheets

Related U.S. Application Data

(60) Provisional application No. 62/171,728, filed on Jun. 5, 2015, provisional application No. 62/021,660, filed on Jul. 7, 2014.

(56) References Cited

U.S. PATENT DOCUMENTS

| | | |
|---|---|---|
| 7,176,530 B1 | 2/2007 | Bulucea et al. |
| 7,187,577 B1 | 3/2007 | Wang et al. |
| 7,274,064 B2 | 9/2007 | Bertin et al. |
| 7,280,390 B2 | 10/2007 | Kostylev et al. |
| 7,368,752 B2 | 5/2008 | Luyken et al. |
| 7,388,775 B2 | 6/2008 | Bedeschi et al. |
| 7,579,612 B2 | 8/2009 | Tang et al. |
| 7,704,788 B2 | 4/2010 | Youn et al. |
| 7,786,464 B2 | 8/2010 | Nirschl et al. |
| 7,791,060 B2 | 9/2010 | Aochi et al. |
| 7,829,875 B2 | 11/2010 | Scheuerlein |
| 7,830,698 B2 | 11/2010 | Chen et al. |
| 7,835,174 B2 * | 11/2010 | Tokiwa ............... G11C 13/00 365/100 |
| 7,859,884 B2 | 12/2010 | Scheuerlein |
| 7,881,097 B2 | 2/2011 | Hosomi et al. |
| 7,897,953 B2 | 3/2011 | Liu |
| 7,920,412 B2 | 4/2011 | Hosotani et al. |
| 7,924,138 B2 | 4/2011 | Kinoshita et al. |
| 7,961,506 B2 | 6/2011 | Liu |
| 8,004,882 B2 | 8/2011 | Katti et al. |
| 8,018,760 B2 | 9/2011 | Muraoka et al. |
| 8,045,364 B2 | 10/2011 | Schloss et al. |
| 8,067,815 B2 | 11/2011 | Chien et al. |
| 8,102,698 B2 | 1/2012 | Scheuerlein |
| 8,139,392 B2 | 3/2012 | Hosoi |
| 8,164,948 B2 | 4/2012 | Kattie et al. |
| 8,218,350 B2 | 7/2012 | Kozicki |
| 8,278,170 B2 | 10/2012 | Lee et al. |
| 8,320,160 B2 | 11/2012 | Nazarian |
| 8,329,537 B2 | 12/2012 | Kim et al. |
| 8,351,241 B2 | 1/2013 | Lu et al. |
| 8,369,139 B2 | 2/2013 | Liu et al. |
| 8,411,485 B2 | 4/2013 | Nazarian et al. |
| 8,502,185 B2 | 8/2013 | Lu et al. |
| 8,587,050 B2 | 11/2013 | Ohba |
| 8,659,933 B2 | 2/2014 | Jo |
| 8,735,247 B2 | 5/2014 | Yoo et al. |
| 8,767,441 B2 | 7/2014 | Lu et al. |
| 8,993,397 B2 | 3/2015 | Herner |
| 9,023,719 B2 | 5/2015 | Pachamuthu et al. |
| 9,305,624 B2 | 4/2016 | Shepard |
| 2001/0007447 A1 | 7/2001 | Tanaka et al. |
| 2004/0114413 A1 | 6/2004 | Parkinson et al. |
| 2004/0170040 A1 | 9/2004 | Rinerson et al. |
| 2006/0097238 A1 | 5/2006 | Breuil et al. |
| 2006/0231910 A1 | 10/2006 | Hsieh et al. |
| 2007/0268744 A1 | 11/2007 | Taguchi |
| 2008/0192531 A1 | 8/2008 | Tamura et al. |
| 2008/0291719 A1 | 11/2008 | Fackenthal et al. |
| 2009/0014707 A1 | 1/2009 | Lu et al. |
| 2009/0027976 A1 | 1/2009 | Brewer et al. |
| 2009/0122592 A1 | 5/2009 | Tokiwa |
| 2009/0231911 A1 | 9/2009 | Liu et al. |
| 2009/0315092 A1 | 12/2009 | Mikasa |
| 2010/0008127 A1 | 1/2010 | Muraoka et al. |
| 2010/0124093 A1 | 5/2010 | Shiga et al. |
| 2010/0157656 A1 | 6/2010 | Tsuchida |
| 2010/0176367 A1 | 7/2010 | Liu |
| 2010/0220523 A1 | 9/2010 | Modha et al. |
| 2010/0237314 A1 | 9/2010 | Tsukamoto et al. |
| 2010/0243983 A1 | 9/2010 | Chiang et al. |
| 2010/0252909 A1 | 10/2010 | Nakanishi et al. |
| 2011/0033967 A1 | 2/2011 | Lutz et al. |
| 2011/0089391 A1 | 4/2011 | Mihnea et al. |
| 2011/0149639 A1 | 6/2011 | Carter et al. |
| 2011/0175087 A1 | 7/2011 | Yamazaki et al. |
| 2011/0305065 A1 | 12/2011 | Nazarian et al. |
| 2011/0310656 A1 | 12/2011 | Kreupl et al. |
| 2011/0317470 A1 | 12/2011 | Lu et al. |
| 2012/0007035 A1 | 1/2012 | Jo et al. |
| 2012/0025160 A1 | 2/2012 | Sonehara |
| 2012/0044751 A1 | 2/2012 | Wang et al. |
| 2012/0112156 A1 | 5/2012 | Park et al. |
| 2012/0122290 A1 | 5/2012 | Nagashima |
| 2012/0132971 A1 | 5/2012 | Mikasa |
| 2012/0176831 A1 | 7/2012 | Xiao et al. |
| 2012/0187410 A1 | 7/2012 | Yamazaki et al. |
| 2012/0211719 A1 | 8/2012 | Haimoto et al. |
| 2012/0211722 A1 | 8/2012 | Kellam et al. |
| 2012/0236650 A1 | 9/2012 | Nazarian |
| 2012/0250395 A1 | 10/2012 | Nodin |
| 2012/0305879 A1 | 12/2012 | Lu et al. |
| 2012/0314472 A1 | 12/2012 | Chung |
| 2013/0001501 A1 | 1/2013 | Sills |
| 2013/0264534 A1 | 10/2013 | Hwang et al. |
| 2013/0313508 A1 | 11/2013 | Kawasaki |
| 2013/0334593 A1 | 12/2013 | Seol et al. |
| 2014/0048860 A1 | 2/2014 | Mikasa et al. |
| 2014/0063903 A1 | 3/2014 | Chang et al. |
| 2014/0092669 A1 | 4/2014 | Chen et al. |
| 2014/0098594 A1 | 4/2014 | Azuma et al. |
| 2014/0112058 A1 * | 4/2014 | Kellam ............... G11C 13/00 365/148 |
| 2014/0231740 A1 | 8/2014 | Ohba |
| 2014/0284544 A1 | 9/2014 | Miyagawa et al. |
| 2014/0292365 A1 | 10/2014 | Said |
| 2015/0070966 A1 | 3/2015 | Bandyopadhyay et al. |
| 2015/0074326 A1 | 3/2015 | Castro |
| 2015/0076579 A1 | 3/2015 | Tsuji et al. |
| 2015/0179662 A1 | 6/2015 | Makala et al. |
| 2015/0179705 A1 | 6/2015 | Wouters et al. |
| 2015/0187792 A1 | 7/2015 | Shingu et al. |
| 2015/0294716 A1 | 10/2015 | Tortorelli et al. |
| 2016/0012886 A1 | 1/2016 | Nazarian et al. |
| 2016/0104715 A1 | 4/2016 | Pachamuthu et al. |
| 2016/0111639 A1 | 4/2016 | Wells et al. |
| 2016/0141337 A1 | 5/2016 | Shimabukuro et al. |
| 2016/0190208 A1 | 6/2016 | Nazarian et al. |
| 2016/0204117 A1 | 7/2016 | Liu et al. |
| 2016/0211386 A1 | 7/2016 | Tomai et al. |
| 2016/0268341 A1 | 9/2016 | Nazarian |
| 2017/0104031 A1 | 4/2017 | Clark et al. |
| 2017/0169887 A1 | 6/2017 | Widjaja |
| 2017/0352410 A1 | 12/2017 | Castro |

FOREIGN PATENT DOCUMENTS

| | | |
|---|---|---|
| CN | 101501850 A | 8/2009 |
| CN | 102986048 A | 3/2013 |
| CN | 103682091 A | 3/2014 |
| JP | 2000058681 | 2/2000 |
| JP | 2001249324 A | 9/2001 |
| JP | 2008277543 A | 11/2008 |
| JP | 2009267185 A | 11/2009 |
| JP | 2010009669 A | 1/2010 |
| JP | 2010087007 A | 4/2010 |
| JP | 2010519762 A | 6/2010 |
| JP | 2010186872 A | 8/2010 |
| JP | 201123645 A | 2/2011 |
| JP | 2011129639 A | 6/2011 |
| JP | 2014036034 A | 2/2014 |
| TW | 201214673 A | 4/2012 |
| WO | 2011005266 A1 | 1/2011 |
| WO | 2013052321 A2 | 4/2013 |

OTHER PUBLICATIONS

Office Action dated Mar. 17, 2015 for U.S. Appl. No. 14/573,770, 19 pages.

Wouters, "Scaling challenges for 2-terminal select devices," ITRS ERD Selector Workshop, Apr. 2012, 41 pages, IMEC, Noorderwijk, NL.

Office Action dated May 27, 2015 for U.S. Appl. No. 14/588,185, 23 pages.

(56) References Cited

OTHER PUBLICATIONS

Office Action dated Jun. 19, 2012 for U.S. Appl. No. 13/149,757, 11 pages.
International Search Report and Written Opinion for PCT Application No. PCT/US2015/17370 dated Jul. 13, 2015, 17 pages.
Office Action dated Oct. 3, 2013 for U.S. Appl. No. 13/921,157, 10 pages.
International Search Report and Written Opinion for PCT Application No. PCT/US2012/040232 dated Feb. 26, 2013, 9 pages.
Office Action dated May 7, 2013 for U.S. Appl. No. 13/585,759, 12 pages.
Office Action dated May 23, 2013 for U.S. Appl. No. 13/592,224, 9 pages.
Notice of Allowance dated Sep. 19, 2013 for U.S. Appl. No. 13/585,759, 9 pages.
Office Action dated Dec. 6, 2013 for U.S. Appl. No. 13/960,735, 10 pages.
International Search Report and Written Opinion for PCT Application No. PCT/US2013/054976 dated Dec. 16, 2013, 9 pages.
Notice of Allowance dated Jul. 22, 2015 for U.S. Appl. No. 14/612,025, 11 pages.
Chinese Office Action (with English translation) dated Nov. 23, 2015 for Chinese Patent Application No. 201280027066.9, 12 pages.
Office Action dated Aug. 3, 2015 for U.S. Appl. No. 14/717,185, 26 Pages.
Ex Parte Quayle Office Action dated Aug. 18, 2016 for U.S. Appl. No. 14/795,105, 13 Pages.
Office Action dated Apr. 8, 2016 for U.S. Appl. No. 14/573,770, 8 Pages.
Office Action dated Jul. 14, 2016 for U.S. Appl. No. 14/793,392, 28 pages.
Office Action dated Jul. 13, 2016 for U.S. Appl. No. 14/755,998, 22 pages.
Office Action dated May 31, 2016 for U.S. Appl. No. 14/678,112, 14 pages.
Notice of Allowance dated Oct. 20, 2016 for U.S. Appl. No. 15/066,504, 28 pages.
Japanese Office Action dated Aug. 2, 2016 for Japanese Application No. 2015-102280, 13 pages (including translation).
Taiwanese Office Action dated Aug. 19, 2016 for Taiwanese Application No. 104107381, 7 pages (including translation).
Japanese Office Action dated Aug. 9, 2016 for Japanese Application No. 2015-137033, 6 pages (including translation).
Taiwanese Office Action dated Aug. 11, 2016 for Taiwanese Application No. 104121989, 10 pages (including translation).
Taiwanese Office Action dated Oct. 19, 2016 for Taiwanese Application No. 104122122, 7 pages (including translation).
Office Action dated Dec. 22, 2016 for U.S. Appl. No. 14/641,466, 45 pages.
Office Action dated Dec. 29, 2016 for U.S. Appl. No. 15/195,417, 38 pages.
Chinese Office Action dated Dec. 27, 2016 for Chinese Patent Application No. 201510105630.X, 16 pages (including English translation).
Korean Office Action dated Feb. 27, 2017 for Korean Application No. 10-2015-0096673, 7 pages (including English translation).
Korean Office Action dated Mar. 6, 2017 for Korean Application No. 10-2015-0097600, 5 pages (including English translation).
Chinese Office Action dated Apr. 5, 2017 for Chinese Patent Application No. 201510260810.5, 16 pages (including English translation).
Office Action dated Jul. 6, 2016 for U.S. Appl. No. 14/726,071, 25 Pages.
Office Action dated Dec. 15, 2016 for U.S. Appl. No. 14/726,071, 62 pages.
Wolf, "Silicon Processing for the VLSI Era vol. 3: The Submicron Mosfet", Lattice Press, 1995, pp. 200-201.
Office Action dated Mar. 30, 2017 for U.S. Appl. No. 14/726,071, 64 pages.
Chinese Office Action dated Dec. 11, 2017 for Chinese Patent Application No. 201510260810.5, 6 pages (including English translation).
Office Action dated Aug. 21, 2017 for U.S. Appl. No. 14/726,071, 93 pages.
Notice of Allowance dated Jul. 31, 2017 for U.S. Appl. No. 15/195,458, 58 pages.
Office Action dated Aug. 29, 2017 for U.S. Appl. No. 15/256,007, 59 pages.
Office Action dated Oct. 6, 2017 for U.S. Appl. No. 15/469,179, 29 pages.
Search Report dated Dec. 27, 2016 for Chinese Patent Application No. 201510105630.X, 1 page.
Office Action dated Jan. 11, 2018 for U.S. Appl. No. 14/793,392, 53 pages.
Office Action dated Jan. 17, 2018 for U.S. Appl. No. 14/726,071, 99 pages.
Office Action dated Jan. 26, 2017 for U.S. Appl. No. 14/793,392, 39 pages.
Communication pursuant to Rules 70(2) and 70a(2) EPC dated Nov. 7, 2017 issued in European Application No. 15762196.2, 1 page.
Korean Office Action dated Oct. 30, 2017 for Korean Application No. 10-2015-0096673, 7 pages (including English translation).
European Office Action and Search Report dated Oct. 18, 2017 for European Application No. 15762196.2, 7 pages.
Final Office Action dated May 25, 2018 for U.S. Appl. No. 15/256,007.
Notice of Allowance dated May 16, 2018 for U.S. Appl. No. 15/469,179, 37 pages.
Notice of Allowance dated Jul. 2, 2018 for U.S. Appl. No. 15/797,447, 38 pages.
Search Report dated Jul. 8, 2016 for Japanese Application No. JP2015-137033.

\* cited by examiner

600 ⇘

```
┌─────────────────────────────────────────┐
│ APPLYING A FIRST VOLTAGE ACROSS A FIRST │
│ ELECTRODE OF A MEMORY/SELECTION         │
│ DEVICE, HAVING A MAGNITUDE LARGER THAN  │── 602
│ AN ACTIVATION MAGNITUDE OF THE          │
│ SELECTION DEVICE, SWITCHING THE         │
│ SELECTION DEVICE FROM A HIGH SELECTION  │
│ RESISTANCE TO A LOW SELECTION           │
│ RESISTANCE                              │
└─────────────────────────────────────────┘
                    │
                    ▼
┌─────────────────────────────────────────┐
│ APPLYING A SECOND VOLTAGE BETWEEN THE   │
│ FIRST ELECTRODE AND THE SECOND          │
│ ELECTRODE HAVING A SECOND MAGNITUDE     │── 604
│ BELOW THE ACTIVATION MAGNITUDE OF THE   │
│ SELECTION DEVICE                        │
└─────────────────────────────────────────┘
                    │
                    ▼
┌─────────────────────────────────────────┐
│ MEASURING A VALUE OF A READ CURRENT     │
│ THROUGH THE RESISTIVE SWITCHING MEDIUM  │
│ IN RESPONSE TO THE SECOND VOLTAGE AND   │── 606
│ DETERMINING A RESISTIVE STATE OF THE    │
│ RESISTIVE SWITCHING MEDIUM IN RESPONSE  │
│ TO THE VALUE OF THE READ CURRENT        │
└─────────────────────────────────────────┘
```

FIG. 6

SENSING A NON-VOLATILE MEMORY DEVICE UTILIZING SELECTOR DEVICE HOLDING CHARACTERISTICS

RELATED APPLICATIONS

The present application for patent is a continuation of U.S. patent application Ser. No. 14/755,998, filed Jun. 30, 2015, and titled "SENSING A NON-VOLATILE MEMORY DEVICE UTILIZING SELECTOR DEVICE HOLDING CHARACTERISTICS," issued as U.S. Pat. No. 9,633,724 on Apr. 25, 2017, which claims the benefit of priority to U.S. Provisional Patent Application No. 62/171,728, filed on Jun. 5, 2015, and titled "SENSING A RESISTIVE MEMORY DEVICE UTILIZING SELECTOR DEVICE HOLDING CHARACTERISTICS," and claims the benefit of priority to U.S. Provisional Patent Application No. 62/021,660, filed on Jul. 7, 2014, and titled "FIELD ASSISTED SUPERLINEAR THRESHOLD (FAST™)," the entirety of which applications are hereby incorporated by reference herein in their respective entireties and for all purposes.

TECHNICAL FIELD

This disclosure relates generally to electronic memory; for example, the disclosure describes the sensing of non-volatile resistive memory utilizing holding characteristics of a selector device of the resistive memory.

BACKGROUND

A recent innovation within the field of integrated circuit technology is two-terminal memory. Two-terminal memory technology is contrasted, for instance, with gate-controlled memory in which conductivity between two terminals is mediated by a third terminal, called a gate terminal. Two-terminal memory devices can differ from three terminal devices in function as well as structure. For instance, some two-terminal devices can be constructed between a pair of conductive contacts, as opposed to having a third terminal that is adjacent to a set of conductive terminals. Rather than being operable through a stimulus applied to the third terminal, two-terminal memory devices can be controlled by applying a stimulus at one or both of the pair of conductive contacts. The inventors of the present disclosure are further aware of a variety of two-terminal memory technologies, such as phase-change memory, magneto-resistive memory, as well as others.

One two-terminal memory expected to have promising physical characteristics is resistive memory. While much of resistive memory technology is in the development stage, various technological concepts for resistive memory have been demonstrated by the assignee of the present invention and are in one or more stages of verification to prove or disprove associated theory(ies). Even so, resistive memory technology promises to hold substantial advantages over competing technologies in the semiconductor electronics industry.

As models of resistive memory technology are tested and results obtained, the results are speculatively extrapolated to memory devices in which resistive memory replaces a conventional memory. For instance, the assignee of the present invention has conducted research related to software models of memory arrays comprising resistive memory instead of complementary metal-oxide semiconductor (CMOS) NAND or NOR memory. Software projections suggest that two-terminal memory arrays can provide significant benefits for electronic devices, including reduced power consumption, higher memory density, advanced technology nodes, or improved performance, among others. In light of the above, the inventors endeavor to discover applications where two-terminal memory can provide real-world benefits for electronic devices.

SUMMARY

The following presents a simplified summary of the specification in order to provide a basic understanding of some aspects of the specification. This summary is not an extensive overview of the specification. It is intended to neither identify key or critical elements of the specification nor delineate the scope of any particular embodiments of the specification, or any scope of the claims. Its purpose is to present some concepts of the specification in a simplified form as a prelude to the more detailed description that is presented in this disclosure.

The present disclosure provides for sensing non-volatile resistive memory to achieve higher sensing margins, in various embodiments. The sensing can leverage current-voltage (I-V) characteristics of a selector device within the resistive memory. For instance, in one or more embodiments, sensing can comprise activating the selector device with an activation voltage, and then lowering the activation voltage to a holding voltage at which the selector device deactivates for an off-state memory cell, but remains active for an on-state memory cell. Accordingly, very high on-off ratio characteristics of the selector device can be employed for sensing the resistive memory, providing sensing margins not previously achievable for non-volatile memory.

Disclosed is a method for sensing data stored in a non-volatile memory in electrical series with a volatile selection device, comprising applying a first voltage across a first electrode and a second electrode of the non-volatile memory having a magnitude larger than an activation magnitude of the volatile selection device, thereby switching the volatile selection device from a high selection resistance to a low selection resistance; applying a second voltage across the first electrode and the second electrode having a second magnitude smaller than the activation magnitude of the volatile selection device; and determining a data value stored by the non-volatile memory in response to the non-volatile memory.

In a further embodiment, a method of reading a one transistor, multiple resistor (1TnR) array of resistive memory is provided. The method can comprise applying a disturb inhibition voltage to a non-target bitline of a 1TnR memory cell array and applying a second disturb inhibition voltage to a non-target wordline of the 1TnR memory cell array. Further, the method can comprise applying an activation voltage across a target bitline and a target wordline of the 1TnR resistive memory cell array, the target bitline and target wordline are respectively connected to a target memory cell. In addition to the foregoing, the method can comprise applying a hold voltage across the target bitline and the target wordline, the hold voltage having a magnitude less than the activation voltage and measuring a read current value through the target memory cell in response to applying the hold voltage.

In a further embodiment, disclosed is a method for operating a memory cell comprising a two-terminal non-volatile memory device in electrical series with a filamentary volatile resistive switching device. The method can comprise applying a first voltage magnitude to the memory cell selected to cause the filamentary volatile resistive switching device to enter a low resistance state and applying a second, non-zero voltage magnitude to the memory cell smaller than the first voltage magnitude and lower than an activation threshold voltage of the filamentary volatile resistive switching device. Moreover, the method can comprise sensing a data value stored by the two-terminal non-volatile memory device in response to applying the second, non-zero voltage magnitude.

In yet another embodiment, the disclosure provides a method for reading a resistive memory cell in a one-transistor, multiple resistive memory cell (1TnR) array of resistive memory, wherein the resistance memory cell comprises a two-terminal non-volatile device in electrical series with a filamentary selector device. The method can comprise applying an activation voltage to a target bitline connected to the resistive memory cell, the activation voltage having a magnitude selected to cause a conductive metal filament to form in the filamentary selector device and to transition from a relatively high resistance state to a relatively low resistance state. Further, the method can comprise reducing the activation voltage to a hold voltage selected to maintain the conductive metal filament in the filamentary selector device in response to the two-terminal non-volatile device conducting a first current in response to the hold voltage, and to deform the conductive metal filament in the filamentary selector device in response to the two-terminal non-volatile device conducting a second current in response to the hold voltage, wherein the second current is smaller than the first current. Still further, the method can comprise determining a data value stored by the two-terminal non-volatile device from the first current or the second current.

The following description and the drawings set forth certain illustrative aspects of the specification. These aspects are indicative, however, of but a few of the various ways in which the principles of the specification may be employed. Other advantages and novel features of the specification will become apparent from the following detailed description of the specification when considered in conjunction with the drawings.

BRIEF DESCRIPTION OF THE DRAWINGS

Various aspects or features of this disclosure are described with reference to the drawings, wherein like reference numerals are used to refer to like elements throughout. In this specification, numerous specific details are set forth in order to provide a thorough understanding of this disclosure. It should be understood, however, that certain aspects of the subject disclosure may be practiced without these specific details, or with other methods, components, materials, etc. In other instances, well-known structures and devices are shown in block diagram form to facilitate describing the subject disclosure;

FIG. 6 depicts a flowchart of a sample method for sensing a memory cell using selector device holding characteristics, in further embodiments;

DETAILED DESCRIPTION

Figure 1:
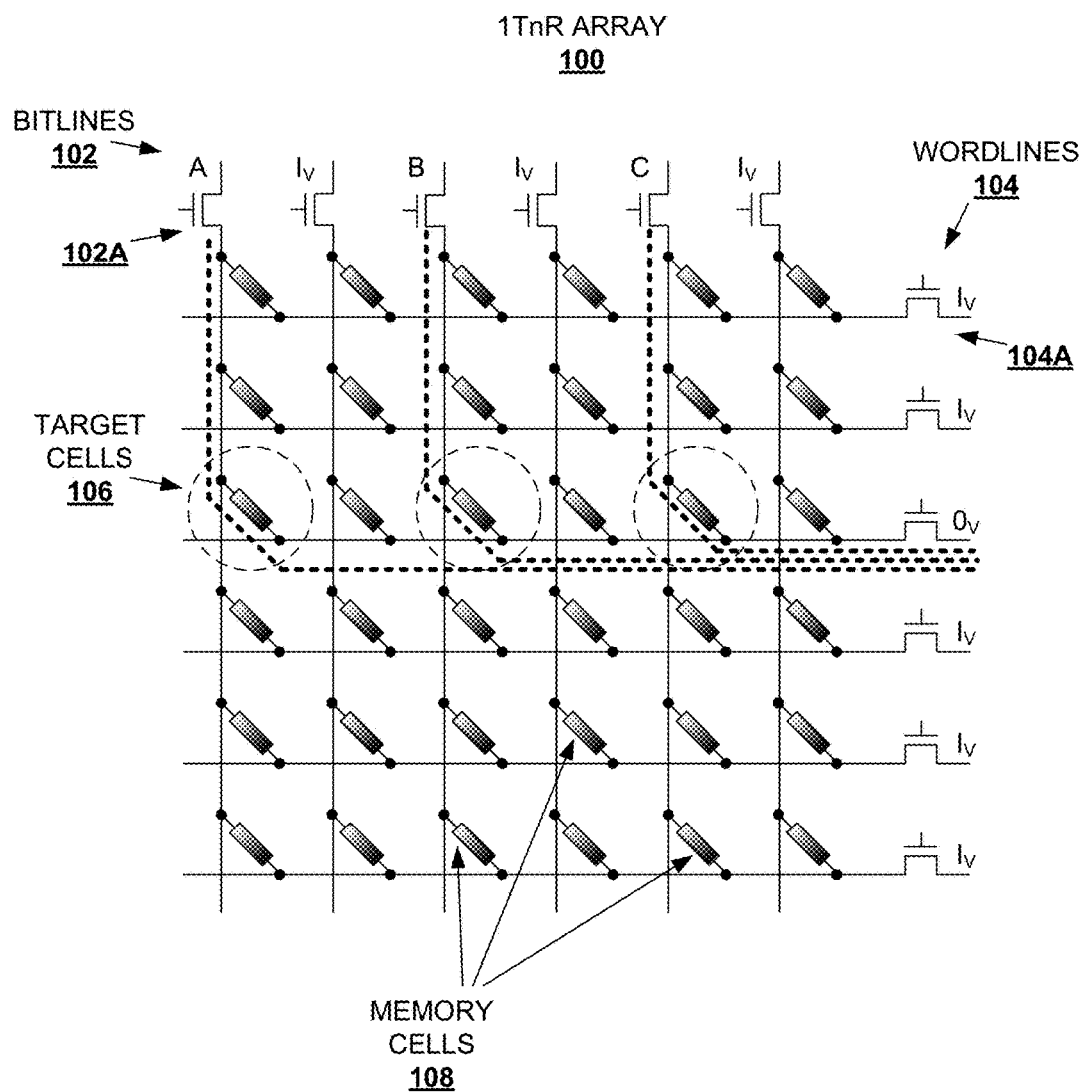
FIG. 1 depicts a diagram of an example memory cell array and targeted sensing operation according to one or more disclosed embodiments.

Embodiments of the present disclosure relate to improved sensing for two-terminal memory devices comprising a selector device. Disclosed sensing techniques can leverage characteristics of the selector device within the two-terminal memory device to accomplish the improved sensing. For instance, greatly increased sensing margins can be achieved. In turn, the increased sensing margin can mitigate the effects of leakage current within a crosspoint array, facilitating larger and higher density memory arrays, larger operational bandwidth (e.g., the ability to read or write larger numbers of memory cells concurrently), as well as other benefits.

As utilized herein, a selector device can be a volatile switching component in electrical series with a non-volatile memory cell. Further, the selector device will generally have very high ratio of on current (e.g., when the selector device has low electrical resistance) to off current (e.g., when the selector device has high electrical resistance). This ratio of on current to off current is also referred to herein as an on/off current ratio. As an illustrative example, the selector device can be a FAST™ selector device under development by the current assignee of the present application for patent, although other selector devices (e.g., an Ovonic switch, a metal-insulator-transition (MIT) device, a MOTT insulator, etc.) can be employed consistent with one or more embodiments as well.

In further embodiments, improved sensing can be accomplished by activating a target memory cell with an activation voltage, having a magnitude sufficient to cause a selector device of the target memory cell to enter a low selector resistance state. After an activation period, a holding voltage is applied that is smaller in magnitude than the activation voltage. Further, the holding voltage can be selected to cause the selector device to enter the high selector resistance state in response to a non-volatile memory device being in a high memory resistance state, and cause the selector device to remain in the low selector resistance state in response to the non-volatile memory device being in a low memory resistance state. Accordingly, at the holding voltage, the on/off current ratio of the target memory cell is driven by the selector device rather than by the non-volatile memory device. Because the selective device can have a much larger on/off current ratio than the non-volatile memory device, sensing at the holding voltage facilitates greatly improved sensing margins for the target memory cell.

Sensing operation and improved sensing margin are described in more detail below, but in brief: in response to the activation voltage, and the selector device being in the low selector resistance state, a current through the target memory cell will be determined by a memory resistance of the non-volatile memory device of the target memory cell. For example, current at the target memory cell will be a relatively high magnitude current in response to the non-volatile memory device having low memory resistance, and will be a relatively low magnitude current in response to the non-volatile memory device having high memory resistance. Sensing margin is generally governed—at least on the level of a single memory cell—by the on/off current ratio of the target cell, and non-volatile memory devices often have on/off current ratios between about 10E3 and about 10E6. Accordingly, when the non-volatile memory device determines the on/off current ratio of the target cell, the sensing margin is limited by this 10E3 to 10E6 ratio. In contrast, however, when the activation voltage is decreased to the holding voltage, the selector device can determine the on/off current ratio of the target cell. Further, the selector device can have an on/off current ratio in a range of about 10E9 to about 10E 12, facilitating much larger sensing margins than those achieved when the non-volatile memory device determines the on/off current ratio of the target cell.

This disclosure relates to improved sensing for an array of memory cells, where respective memory cells of the array comprise a selector device and a two-terminal memory device. Referring more generally to the disclosed embodiments, two-terminal memory cells can include a resistive technology, such as a resistive-switching two-terminal memory cell. Resistive-switching two-terminal memory cells (also referred to as resistive-switching memory cells or resistive-switching memory), as utilized herein, comprise circuit components having a pair of conductive contacts with an active region between the conductive contacts. The active region of the two-terminal memory device, in the context of resistive-switching memory, exhibits a plurality of stable or semi-stable resistive states, each resistive state having a distinct electrical resistance. Moreover, respective ones of the plurality of states can be formed or activated in response to a suitable electrical signal applied at the conductive contacts. These electrical signals can be selected to have suitable characteristics, such as a voltage or current value, a voltage or current polarity, a field strength, a field polarity, or the like, or a suitable combination thereof. Examples of a resistive switching two-terminal memory device, though not exhaustive, can include a resistive random access memory (RRAM), a phase change RAM (PCRAM) and a magnetic RAM (MRAM).

Further to the above, embodiments of the subject disclosure provide a volatile selector device that can be integrated with a non-volatile two-terminal memory device. The selector device and non-volatile memory device can have different orientations, but are generally constructed to be electrically in series. In various embodiments, the volatile selector device or the non-volatile memory cell can be filamentary-based devices. One example of a filamentary-based device can comprise: a conductive layer, e.g., metal, doped p-type (or n-type) silicon (Si) bearing layer (e.g., p-type or n-type polysilicon, p-type or n-type polycrystalline SiGe, etc.), a resistive switching layer (RSL) and an active metal layer capable of being ionized. Under suitable conditions, the active metal layer can provide filament forming ions to the RSL. In such embodiments, a conductive filament (e.g., formed by the ions) can facilitate electrical conductivity through at least a subset of the RSL, and a resistance of the filament-based device can be determined, as one example, by a tunneling resistance between the filament and the conductive layer.

In various embodiments of a memory cell of the present disclosure, a p-type or n-type Si bearing layer can include a p-type or n-type polysilicon, p-type or n-type polycrystalline SiGe, or the like. A RSL (which can also be referred to in the art as a resistive switching media (RSM)) can comprise, e.g., an undoped amorphous Si layer, a semiconductor layer having intrinsic characteristics, a Si sub-oxide (e.g., SiOx wherein x has a value between 0.1 and 2), and so forth. Other examples of materials suitable for the RSL could include $Si_XGe_YO_Z$ (where X, Y and Z are respective suitable positive numbers), a silicon oxide (e.g., $SiO_N$, where N is a suitable positive number), amorphous Si (a-Si), amorphous SiGe (a-SiGe), $TaO_B$ (where B is a suitable positive number), $HfO_C$ (where C is a suitable positive number), $TiO_D$ (where D is a suitable number), $Al_2O_E$ (where E is a suitable positive number) and so forth, or a suitable combination thereof.

In some embodiments, a RSL employed as part of a non-volatile memory device can include a number of material voids or defects to trap particles (at least at low voltage) within the RSL. These trapped particles can maintain the non-volatile memory device in a low resistance state in the absence of an external stimulus (e.g., electrical power), thereby achieving non-volatile operation. In other embodiments, a RSL employed for a volatile selector device can have very few material voids or defects. Accordingly, the selector device has minimal or no capacity to trap particles. Thus, the selector device can form a conductive filament in response to a suitable external stimulus, and in the absence of the external stimulus, filament particles are free to diffuse or drift within, or out of, the RSL, thereby deforming the conductive filament. Note that a RSL and conductive filament for the selector device can have different electrical characteristics than a conductive filament and RSL for the non-volatile memory device. For instance, the selector device RSL can have higher material electrical resistance, and can have higher on/off current ratio, among others.

An active metal layer for a filamentary-based memory cell can include, among others: silver (Ag), gold (Au), titanium (Ti), titanium-nitride (TiN) or other suitable compounds of titanium, nickel (Ni), copper (Cu), aluminum (Al), chromium (Cr), tantalum (Ta), iron (Fe), manganese (Mn), tungsten (W), vanadium (V), cobalt (Co), platinum (Pt), hafnium (Hf), and palladium (Pd). Other suitable conductive materials, as well as compounds, alloys, or combinations of the foregoing or similar materials can be employed for the active metal layer in some aspects of the subject disclosure. Some details pertaining to embodiments of the subject disclosure similar to the foregoing example(s) can be found in the following U.S. patent applications that are licensed to the assignee of the present application for patent application Ser. No. 11/875,541 filed Oct. 19, 2007 and application Ser. No. 12/575,921 filed Oct. 8, 2009, and the following U.S. patent application assigned to the assignee of the present application for patent application Ser. No. 14/588,185 filed Dec. 31, 2014; each of the foregoing patent applications are hereby incorporated by reference herein in their respective entireties and for all purposes.

A filamentary selector device can exhibit a first state (e.g., a first electrical resistance, or other suitable measurable characteristic) in the absence of a suitable external stimulus. The stimulus can have a threshold value or range of such values that induces the filamentary selector device to change from the first state to a second state while the stimulus is applied. In response to the stimulus falling below the threshold value (or threshold range of values) the filamentary selector device returns to the first state. In some disclosed embodiments, a filamentary based selector device can operate in a bipolar fashion, behaving differently in response to different polarity (or direction, energy flow, energy source orientation, etc.) external stimuli. As an illustrative example, in response to a first polarity stimulus exceeding a first threshold voltage (or set of voltages), the filamentary selector device can change to the second state from the first state. Moreover, in response to a second polarity stimulus exceeding a second threshold voltage(s), the filamentary selector device can change to a third state from the first state. In some embodiments, the third state can be substantially the same as the first state, having the same or similar measurably distinct characteristic (e.g., electrical conductivity, and so forth), having the same or similar magnitude of threshold stimulus (though of opposite polarity or direction), or the like. In other embodiments, the third state can be distinct from the second state, either in terms of the measurable characteristic (e.g., different electrically conductivity value in response to the reverse polarity as compared to the forward polarity) or in terms of threshold stimulus associated with transitioning out of the first state (e.g., a different magnitude of positive voltage required to transition to the second state, compared to a magnitude of negative voltage required to transition to the third state).

In some embodiments, and by way of example, a disclosed filamentary based selector device can form a conductive path or filament through a relatively high resistive portion in response to a suitable external stimulus. The external stimulus can cause metallic particles within an active metal layer to migrate within (or ionize within) a RSL layer of the filamentary selector device. As mentioned above, the RSL can be selected to have relatively few physical defect locations for the volatile filamentary switching device, facilitating relatively good mobility of the metallic particles within the RSL. Accordingly, below an associated threshold stimulus (or narrow range of threshold values), the metallic particles can be dispersed within the RSL to prevent formation of a sufficient conductive path through the RSL to lower a high resistance associated with the first state. Above the threshold, the external stimulus maintains the metallic particles in sufficient formation to provide the conductive path, leading to relatively low resistance of the second state. An analogous mechanism can control operation of the third state in the bipolar context.

For a non-volatile filamentary-based memory cell, an RSL can be selected to have sufficient physical defect sites therein so as to trap particles in place in the absence of a suitable external stimulus, mitigating particle mobility, such as drift or dispersion. In response to a suitable program voltage applied across the memory cell, a conductive path or a filament forms through the RSL. In particular, upon application of a programming bias voltage, metallic ions are generated from the active metal layer and migrate into the RSL layer. More specifically, metallic ions migrate to the voids or defect sites within the RSL layer. In some embodiments, upon removal of the bias voltage, the metallic ions become neutral metal particles and remain trapped in voids or defects of the RSL layer. When sufficient particles become trapped, a filament is formed and the memory cell switches from a relatively high resistive state, to a relatively low resistive state. More specifically, the trapped metal particles provide the conductive path or filament through the RSL layer, and the resistance is typically determined by a tunneling resistance through the RSL layer. In some resistive-switching devices, an erase process can be implemented to deform the conductive filament, at least in part, causing the memory cell to return to the high resistive state from the low resistive state. More specifically, upon application of an erase bias voltage, the metallic particles trapped in voids or defects of the RSL become mobile and migrate back towards the active metal layer. This change of state, in the context of memory, can be associated with respective states of a binary bit. For an array of multiple memory cells, a word(s), byte(s), page(s), block(s), etc., of memory cells can be programmed or erased to represent zeroes or ones of binary information, and by retaining those states over time in effect storing the binary information In various embodiments, multi-level information (e.g., multiple bits) may be stored in such memory cells.

It should be appreciated that various embodiments herein may utilize a variety of memory cell technologies, having different physical properties. For instance, different resistive-switching memory cell technologies can have different discrete programmable resistances, different associated program/erase voltages, as well as other differentiating characteristics. For instance, various embodiments of the subject disclosure can employ a bipolar switching device that exhibits a first switching response (e.g., programming to one of a set of program states) to an electrical signal of a first polarity and a second switching response (e.g., erasing to an erase state) to the electrical signal having a second polarity. The bipolar switching device is contrasted, for instance, with a unipolar device that exhibits both the first switching response (e.g., programming) and the second switching response (e.g., erasing) in response to electrical signals having the same polarity and different magnitudes.

Where no specific memory cell technology or program/erase voltage is specified for the various aspects and embodiments herein, it is intended that such aspects and embodiments incorporate any suitable memory cell technology and be operated by program/erase voltages appropriate to that technology, as would be known by one of ordinary skill in the art or made known to one of ordinary skill by way of the context provided herein. It should be appreciated further that where substituting a different memory cell technology would require circuit modifications that would be known to one of ordinary skill in the art, or changes to operating signal levels that would be known to one of such skill, embodiments comprising the substituted memory cell technology(ies) or signal level changes are considered within the scope of the subject disclosure.

The inventors of the subject application are familiar with additional non-volatile, two-terminal memory structures in addition to resistive memory. For example, ferroelectric random access memory (RAM) is one example. Some others include magneto-resistive RAM, organic RAM, phase change RAM and conductive bridging RAM, and so on. Two-terminal memory technologies have differing advantages and disadvantages, and trade-offs between advantages and disadvantages are common. Though resistive-switching memory technology is referred to with many of the embodiments disclosed herein, other two-terminal memory technologies can be utilized for some of the disclosed embodiments, where suitable to one of ordinary skill in the art.

Referring now to the drawings, FIG. 1 illustrates a diagram of an example crosspoint array of two-terminal memory cells 108, according to various disclosed embodiments. The crosspoint array of FIG. 1 is a one transistor, multiple resistor (1TnR, where n is a suitable positive number) memory array 100. This is illustrated by each bitline 102 and wordline 104 being activated by a single bitline transistor 102A, or wordline transistor 104A, respectively, while being connected to multiple memory cells. Because a single transistor activates or deactivates multiple memory cells 108, the 1TnR array 100 can have leakage currents among bitlines 102 and wordlines 104 of the 1TnR array 100. To illustrate, a signal applied to one of bitlines 102 is observed by each memory cell 108 connected to that bitline 102, which can result in leakage current on each wordline 104 connected to the memory cells 108 on the one bitline 102. Additionally, capacitive coupling between the one bitline 102 and neighboring bitlines 102 can induce voltages on the neighboring bitlines, resulting in additional leakage currents through memory cells on these neighboring bitlines. To mitigate the leakage currents in 1TnR array 100, each of memory cells 108 can comprise a selector device in addition to a non-volatile memory device, configured to suppress leakage currents to very small magnitudes (e.g., see FIG. 3, infra).

1TnR array 100 can be constructed according to a variety of electronic layout schemes. In some embodiments, a bitline 102 can be connected to a first number, n, of memory cells whereas a wordline 104 can be connected to a second number, m, of memory cells, where m is also a suitable positive number. In at least one embodiment, n=m, although the subject disclosure is not so limited and n and m can be different integer values in various embodiments.

1TnR array 100 illustrates a number of target cells 106 associated with an array operation. Three target cells 106 are depicted in 1TnR array 100, although it should be appreciated that other numbers of target cells 106 can be selected for the array operation. Bitlines A, B and C are selected bitlines for the array operation, and their respective bitline transistors 102A are activated. A suitable operation signal is applied to selected bitlines A, B and C, which can include a read signal, write signal, erase signal, or the like. A subset of non-selected bitlines 102—depicted with an inhibit signal $I_V$ adjacent to their respective bitline transistors 102A—can have an inhibit signal applied for the array operation, in some embodiments. This can be implemented for non-selected bitlines 102 immediately adjacent to one of the selected bitlines A, B and C (or separated by fewer than a positive integer, x, of bitlines from one of the selected bitlines A, B and C). The inhibit signal can be selected to mitigate capacitive coupling voltages induced on the neighboring bitlines by the selected bitlines A, B and C, in one or more embodiments.

A wordline(s) 104 connected to target cells 106 is grounded, resulting in a voltage equal to the operation signal across target cells 106. The operation signal voltage causes respective current paths through target cells 106, depicted by dotted lines along the selected bitlines A, B and C and the grounded wordline(s) 104. The inhibit signal $I_V$ can additionally be applied to wordlines 104 not connected to target cells 106. This can facilitate low voltage (varying, for instance, with capacitive coupling voltages from adjacent bitlines) across non-selected bitlines 102 and non-selected wordlines 104, reducing power consumption of the array operation for 1TnR array 100.

In various disclosed embodiments, the array operation can be a sensing operation. For instance, the array operation can be an improved sensing operation that increases sensing margin for read operations of memory cells 108 in a memory array such as 1TnR array 100. The improved sensing margin can be accomplished, at least in part, by leveraging characteristics of a selector device employed for respective memory cells 108. Although sensing signals are often described herein with respect to a single target memory cell, it should be appreciated that embodiments of the present disclosure can be implemented with multiple target cells, such as target cells 106 or other subsets of target cells of a memory array.

Figure 2:
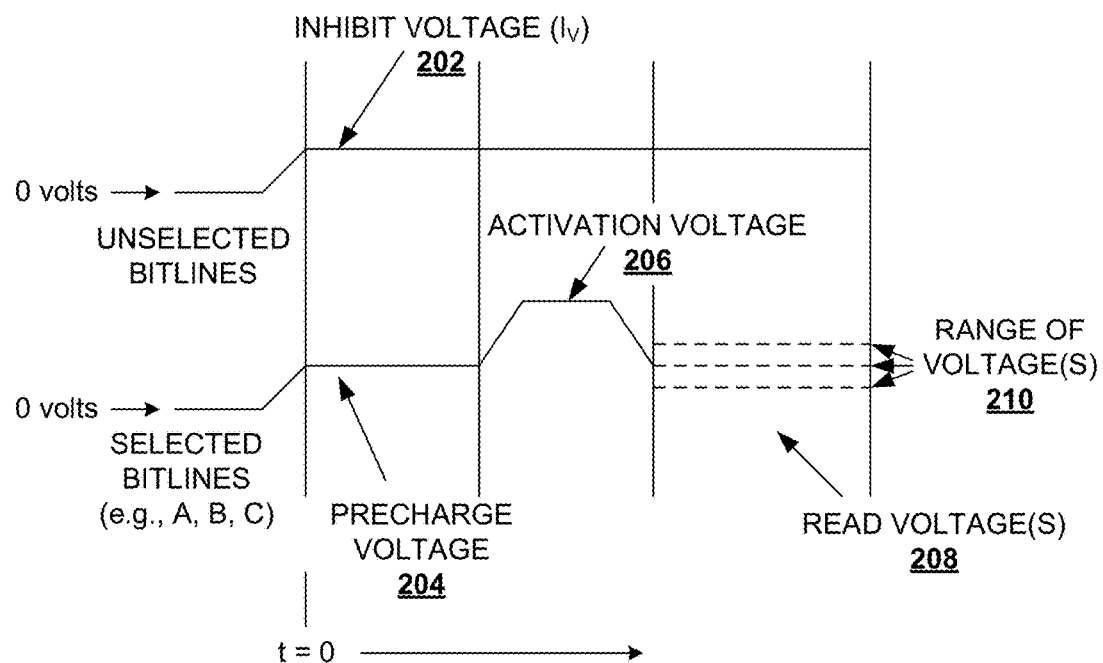
FIG. 2 illustrates a diagram of example sensing signals for disclosed sensing operations in a further embodiment.

FIG. 2 depicts a diagram of example sensing signals 200 that can be employed for disclosed sensing operations for 1TnR array 100 of FIG. 1, in one or more embodiments. Sensing signals 200 are depicted on a two-dimensional axis with voltage magnitude along the vertical axis and time along the horizontal axis. The voltage magnitude is plotted separately for signals applied to unselected bitlines, toward the top of the vertical axis, and for signals applied to selected bitlines A, B and C, toward the bottom of the vertical axis.

A read cycle begins at t=0 on the horizontal axis, where a voltage applied to unselected bitlines can be increased from 0 volts to an inhibit voltage $I_V$ 202. Inhibit voltage 202 can have characteristics (e.g., magnitude, pulse width, etc.) selected to mitigate or avoid disturb errors for memory cells of the 1TnR array 100. As one example, a voltage magnitude of inhibit voltage 202 can be selected to mitigate capacitive coupling voltage(s) between unselected bitlines and selected bitlines of 1TnR array 100, although one of ordinary skill in the art may see additional examples in which mitigating disturb errors could be accomplished within the scope of the present disclosure. In at least one embodiment, inhibit voltage 202 can be selected from a range of about 1.2 volts to about 1.6 volts, although other values or ranges can be employed within the scope of the subject disclosure. Once initiated, inhibit voltage 202 can be maintained for a duration of the read cycle, in at least one embodiment.

For selected bitlines A, B and C, sensing signals 200 can begin at 0 volts at time t=0. In some embodiments, sensing signals 200 can comprise a precharge voltage 204 applied to the selected bitlines. In at least one embodiment, a magnitude of precharge voltage 204 can be about the same as a magnitude of inhibit voltage 202, although the subject disclosure is not limited to this embodiment(s). In such embodiments, precharge voltage 204 can include inhibit voltage 202; expressed differently, precharge voltage 204 can facilitate inhibiting of state change in cells connected to selected bitlines A, B and C, in such embodiments.

Precharge voltage 204 can be maintained for a suitable precharge period. In a particular embodiments, the precharge period can be selected to have a duration selected from about 50 nanoseconds (ns) to about 150 ns (e.g., 75 ns, 100 ns, 125 ns, etc.), although other durations or ranges of durations can be utilized instead. In at least one embodiment, sensing signals 200 do not have a precharge voltage 204, and instead selected bitlines are raised from zero volts to the activation voltage 206.

Activation voltage 206 can have characteristics selected to activate selector devices of memory cells connected to the selected bitlines. In various embodiments, activation voltage characteristics can include voltage magnitude, and activation period. A magnitude of activation voltage 206 can be selected to be from between about 1.4 volts and about 3 volts in some embodiments, and the activation period can be selected to be between about 50 ns and about 150 ns in additional embodiments, though other values or ranges can be employed in still other embodiments. In at least one embodiment, the voltage magnitude can be selected to be about 2.4 volts, and the activation period can be selected to be about 100 ns. In a further embodiment, activation voltage 206 can be increased (e.g., from precharge voltage 204 in some embodiments, or from zero volts in at least one embodiment) at the start of the activation period, so that the selected magnitude of activation voltage 206 is reached some time after the start of the activation period. In an alternative or additional embodiment, activation voltage 206 can be decreased from the selected voltage magnitude before an end of the activation period, so that activation voltage 206 is below the selected voltage magnitude at the end of the activation period.

At the end of the activation period, sensing signals 202 include a read voltage 208 that is applied to the selected bitlines. Read voltage 208 can be selected from a range of suitable read voltages 210. In one or more embodiments, read voltage 208 can be selected according to characteristics of a selector device employed for memory cells of 1TnR array 100. As one example, read voltage 208 can have a magnitude that corresponds with an intrinsic current-voltage response characteristics associated with the selector device of the memory cells. In at least one embodiment, read voltage 208 can have a magnitude that corresponds with deactivation or at least partial deactivation of the selector device in response to a two-terminal memory device paired with the selector device being in a high resistance state, and that corresponds with activation or at least a lesser partial deactivation of the selector device when the two-terminal memory device paired with the selector device is in a low resistance state (e.g., see FIGS. 4 and 5, infra). According to this example then, the selector device is activated (or at least within 80 to 90 percent of electrical conductivity associated with being activated) or deactivated (or at least 80 to 90 percent of the electrical resistivity associated with being deactivated) in response to the two-terminal memory device being programmed or erased, respectively. This embodiment(s) provides a significant benefit for sensing a memory cell, since the selector device has a very high on/off current ratio (e.g., 10E9 or more), and a state of the selector device is indicative of a state of the memory device. As a result, a sensing margin for reading the memory cells can be determined from the on/off current ratio of the selector device, resulting in significantly larger sensing margin than would otherwise be available.

In addition to the foregoing, increased sensing margin can yield significant benefits for an array of memory, such as 1TnR array 100. For instance, larger sensing margin can facilitate a larger number of memory cells per transistor (e.g., n being a larger integer), improving memory density in the 1TnR array 100. Alternatively or in addition, larger sensing margin can result in improved sensing reliability, fewer bit errors, or greater memory longevity, as well as other benefits.

As mentioned above, a magnitude of read voltage 208 can be selected to be within the range of suitable read voltages 210. Range of suitable read voltages 210 can be associated with physical characteristics of a selector device or two-terminal memory device employed for a memory cell, in some embodiments. Thus, for instance, a range of voltages at which the selector device deactivates (or primarily deactivated) for an erased memory device yet remains active (or primarily active) for a programmed memory device, can determine the range of suitable voltages 210 one of ordinary skill in the art would employ for the magnitude of read voltage 208. In at least one embodiment, the range of suitable voltages 210 can be from about 0.8 volts to about 1.5 volts, and read voltage 208 can be selected from this range; however, other ranges are within the scope of the present disclosure, and could be preferred by one of ordinary skill in the art (e.g., based on switching characteristics of a memory cell employed for 1TnR array 100). In one or more alternative or additional embodiments, a read period can also be selected to allow a suitable amount of time for the activation voltage 206 to decrease to the read voltage 208, and for a selector device (associated with a memory device in a low memory conductance state) to deactivate in response to the read voltage 208.

Note that as utilized herein, the terms memory conductance or memory resistance refer to electrical conductivity and electrical resistance, respectively, of a two-terminal memory device. Further, the terms selector conductance or selector resistance refer to electrical conductivity or electrical resistance, respectively, or a selector device. The distinction between memory conductivity/resistance and selector conductivity/resistance is not intended, however, to imply any quantitative distinction. Though in general there may be quantitative distinctions, these terms are utilized as associative qualifiers rather than quantifiers.

Figure 3:
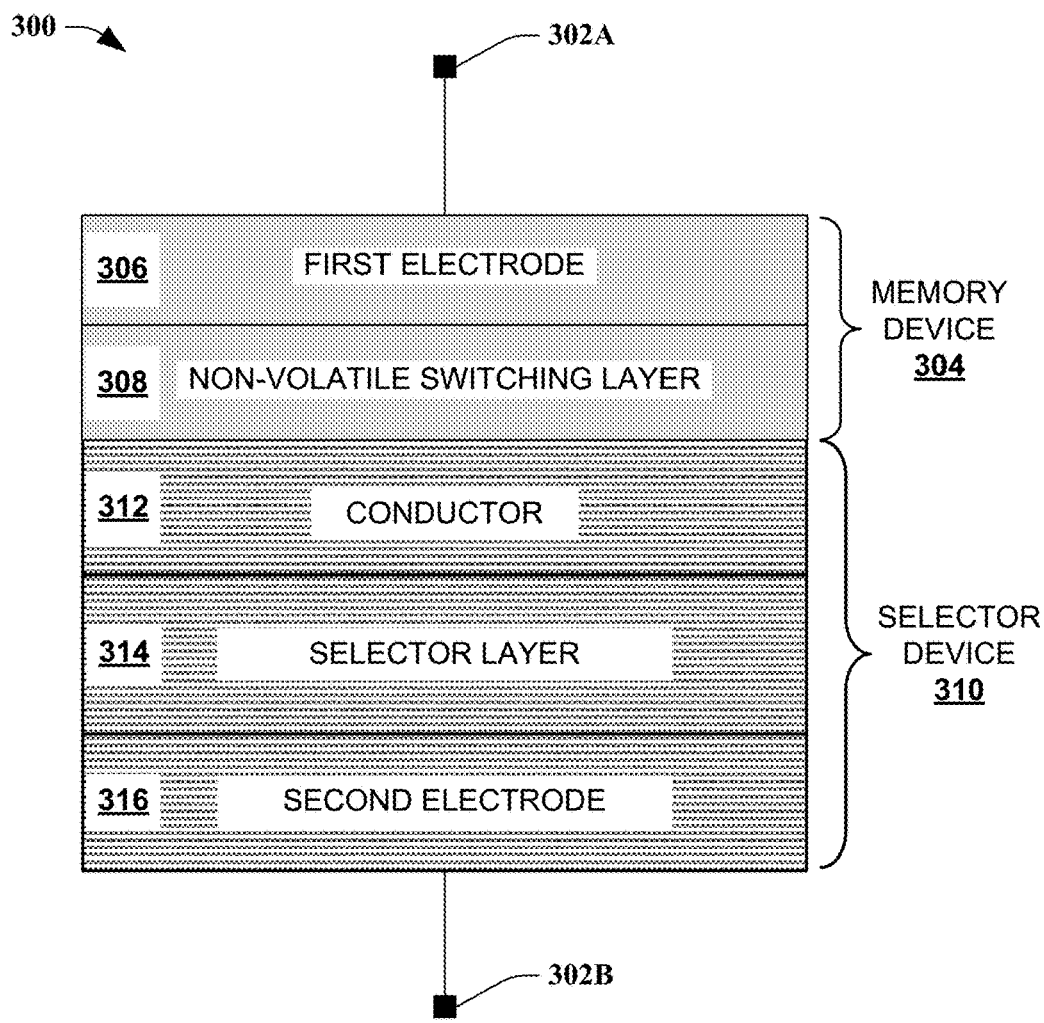
FIG. 3 illustrates a block diagram of an example non-volatile resistive memory cell comprising a selector device, according to various embodiments.

FIG. 3 illustrates a block diagram of an example two-terminal memory cell 300 according to one or more embodiments of the subject disclosure. Two-terminal memory cell 300 can comprise a non-volatile memory device 304 and a volatile selector device positioned between a first electrical contact 302A and a second electrical contact 302B. The electrical contacts 302A and 302B can facilitate application of electrical signals to two-terminal memory cell 300, and can comprise output points of a multiplexer, switch, or the like.

Memory device 304 is a non-volatile memory, and can include a resistive-switching memory (e.g., a resistive random access memory (RRAM)), a conductive-bridging memory, a magneto-resistive memory, a phase-change memory, an organic memory, or the like. Memory device 304 can comprise a first electrode 306 and a non-volatile switching layer 308. Selector device 310 is a volatile switching device. In some embodiments, selector device 310 can be a FAST™ selector device, an Ovonic switch, a metal-insulator-transition (MIT) device, a MOTT insulator or another suitable volatile switching device in various embodiments. More particular examples of memory device 304 and selector device 310 described below and depicted by FIG. 3 are with reference to a non-volatile resistive switching device and a volatile FAST selector device, but it should be appreciated that other non-volatile memory devices or volatile selector devices can be employed.

In some embodiments (e.g., where memory device 304 is a resistive switching non-volatile memory), first electrode 306 can comprise particles that can be ionized in response to a first stimulus (e.g., a signal applied to contacts 302A, 302B, a voltage, a field, and so on). Moreover, the particles can drift or diffuse out from first electrode 306 into non-volatile switching layer 308, in various embodiments, forming a conductive filament(s) within or through non-volatile switching layer 308. The conductive filament(s), at least when ionized, can lower an electrical resistance of memory device 304 (e.g., a memory resistance of memory device 304), switching memory device 304 from a high memory resistance state to a low memory resistance state.

Further, non-volatile switching layer 308 can comprise a suitable number or ratio of voids, defects, fissures, gaps, etc., within a material of non-volatile switching layer 308, suitable to reversibly trap particles of first electrode 306 in place. Thus, for instance, in response to the first stimulus or a weaker stimulus, particles of first electrode 306 become ionized and drift into non-volatile switching layer 308, and some of which become trapped within the voids/defects, etc., thereof. The trapped particles can form the conductive filament introduced above, and at least when ionized, switch memory device 304 into the low memory resistance state. In response to a second stimulus (e.g., a reverse polarity voltage or field, a current or voltage of higher or lower magnitude than the first stimulus, or other suitable stimulus depending on a type of memory technology employed for memory device 304), the particles can be ejected from at least a subset of the voids/defects, etc., sufficient to deform the conductive filament(s) at least enough to break electrical continuity across non-volatile switching layer 308, thereby switching memory device 304 from the low memory resistance state to the high memory resistance state. Absent the second stimulus, such as at low voltages, low field strengths, etc., the particles can remain trapped within non-volatile memory layer 308. Accordingly, in the absence of electrical power, a memory state of memory device 304 is preserved, facilitating non-volatile operation of memory device 304.

Selector device 310 can comprise a conductor 312, a selector layer 314 and a second electrode 316. Conductor 312 can comprise a first set of particles that can be ionized in response to a first external stimulus of a first polarity, and drift or diffuse into selector layer 314. Additionally, the first set of particles can form a first conductive path(s) through selector layer 314, from conductor 312 to second electrode 316 in response to the first external stimulus. Selector layer 314 can be configured to have few voids, defects, gaps, etc., with which to trap particles from conductor 312 (or second electrode 316), and thus in the absence of the first external stimulus, the first conductive path(s) can at least in part deform, breaking electrical continuity (or significantly lowering electrical continuity) of the first conductive path(s). A voltage (or range of voltages) at which the conductive path(s) through selector layer 314 deforms and loses electrical continuity is referred to as a deformation threshold voltage. In various embodiments, it is worth noting that a magnitude (of the first polarity) of this deformation threshold voltage can depend at least in part on a conductive state of memory device 304. For instance, if memory device 304 is in a conductive memory state, deformation of the first conductive path(s) can occur at lower voltages (e.g., within a range of about 0.5 volts to about 1.0 volts) than if memory device 304 is in a resistive memory state (e.g., corresponding to a deformation threshold voltage within a range of about 1.5 volts to about 2.0 volts). In one or more embodiments, conductor 312 can be a suitable active metal, or other suitable conductive particle donor layer as described herein. Further, conductor 312 can be a floating conductor in various embodiments, unconnected to an external power source or ground, and affected instead by signals applied at electrical contacts 302A and 302B.

Second electrode 316 can comprise a second set of particles that can be ionized in response to a second external stimulus of a second polarity, and drift or diffuse into selector layer 314. According to various embodiments, the second external stimulus can have an opposite polarity compared with the first external stimulus (e.g., the second polarity can be negative where the first polarity is positive, or vice versa). Similar to the first set of particles, described above, the second set of particles from second electrode 316 can form a conductive path(s) within selector layer 314, causing selector layer 314 to switch from a high selector resistance to a low selector resistance. When the second external stimulus drops in magnitude below a second deformation voltage, the conductive path(s) formed by the second set of particles can become electrically discontinuous, causing selector layer 314 to switch from the low selector resistance to the high selector resistance. Further, the deformation voltage can depend on the state of memory device 304; a lower magnitude deformation voltage (of the second polarity) can deform the conductive path(s) when memory device 304 is in a conductive memory state, and a higher magnitude deformation voltage can deform the conductive path(s) when memory device 304 is in the resistive memory state.

In operation, memory device 304 can be a bipolar device that is activated (e.g., programmed) in response to a positive polarity signal, and deactivated (e.g., erased) in response to a negative polarity signal. However, for a program or erase signal to have sufficient current to switch memory device 304 from one state to another, selector device 310 has to activate (and be in the low selector resistance state, thereby allowing the current). Accordingly, and in contrast with memory device 304, selector device 310 can be activated (e.g., switch from the high selector resistance state to the low selector resistance state) in response to the positive polarity signal (having a sufficient positive polarity magnitude), and can also be activated in response to the negative polarity signal (having a sufficient negative polarity magnitude). In some embodiments, a voltage or field magnitude sufficient to activate selector device 310 be the same for the positive polarity signal and the negative polarity signal. However, in other embodiments, the positive polarity signal magnitude can be different from the negative polarity signal magnitude, depending on materials employed for conductor 312 or second electrode 316, as one example.

In at least one embodiment, two-terminal memory cell 300 can comprise one or more additional layers, not depicted therein. For instance, a barrier layer can be provided to mitigate or prevent diffusion of atoms or particles from one layer to another. As a particular example, a suitable barrier layer can be provided between conductor 312 and non-volatile switching layer 308, to mitigate or prevent particles of conductor 312 from drifting or diffusing into non-volatile switching layer 308. In other embodiments, a barrier layer can be provided between other such layers. In further embodiments, two-terminal memory cell 300 can comprise a suitable etch stop layer (e.g., W, TiN, TaN, etc.) to improve efficacy of lithographic mask and etch processes, an adhesion layer to mechanically (or chemically) secure one layer to another layer, a continuity layer to promote good ohmic contact between two layers, a passivation layer to mitigate or prevent chemical degradation (e.g., oxidation, and so forth) of one or more layers, and so on.

Figure 4:
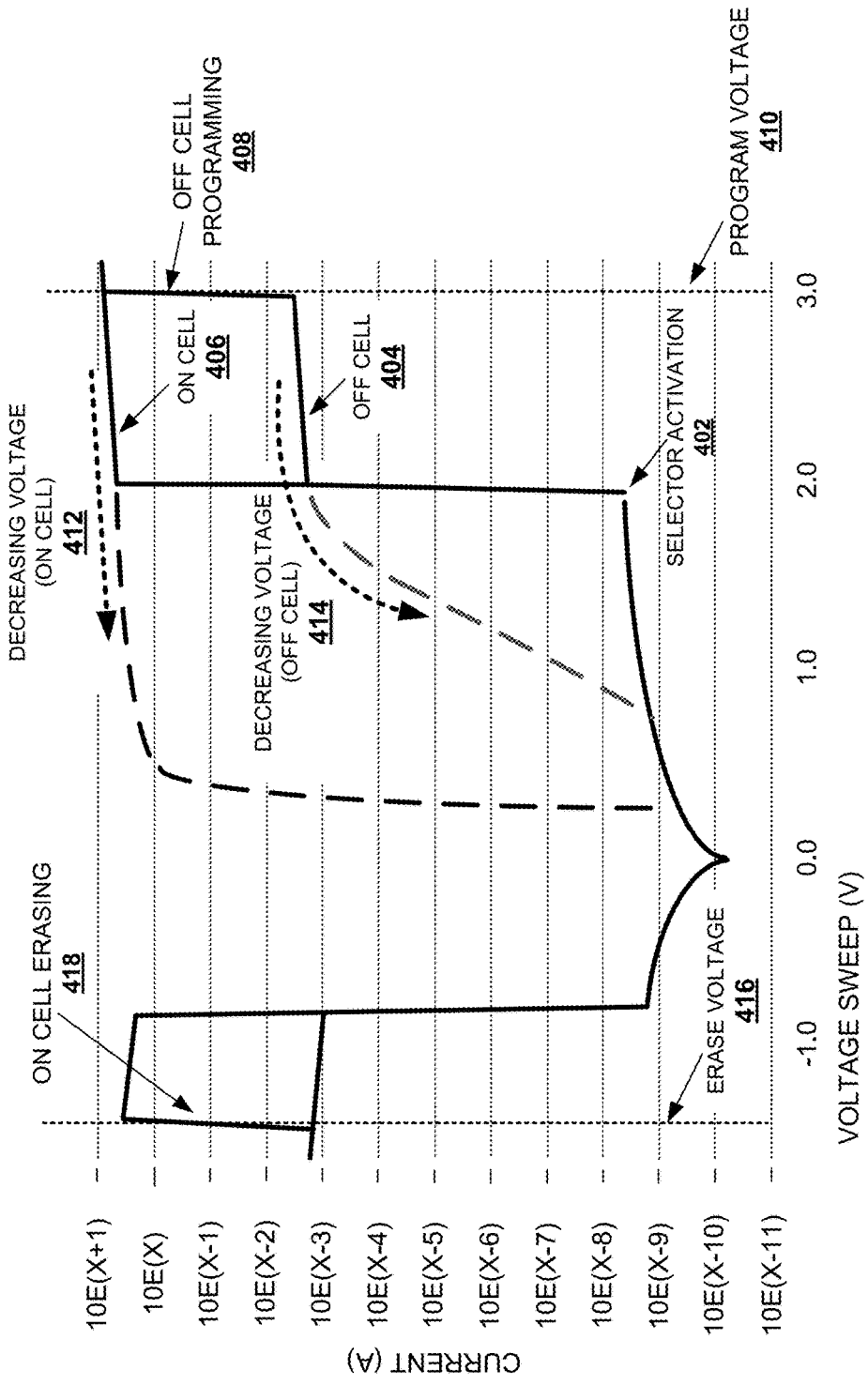
FIG. 4 depicts a diagram of example I-V response for a non-volatile resistive memory comprising a selector device.

FIG. 4 depicts a diagram of an example current-voltage response 400 for a two-terminal memory cell according to further disclosed embodiments. In one or more embodiments, a two-terminal memory cell associated with current-voltage response 400 can be substantially similar to that described at FIG. 3, supra. However, the subject disclosure is not so limited, and it should be appreciated that current-voltage response 400 can correspond with a memory cell embodiment not explicitly described herein, but made known to one of ordinary skill in the art by way of the context provided herein.

Current-voltage response 400 depicts relative current (in amps, A) on a vertical axis and absolute voltage (in volts, V) on a horizontal axis. To more readily depict the on/off ratio of the selector device at a reduced holding voltage, FIG. 4 (and FIG. 5, infra) normalizes current approximately at a voltage for which a selector device deactivates in the case where an associated memory device is in a low memory resistance state. The vertical scale is a logarithmic scale, and thus illustrates an order-of-magnitude change in current per delineation on the vertical scale.

Starting from zero volts and prior to selector activation 402, a selector device of the memory cell is in a high selector resistance state. Selector devices tend to have very high electrical resistance when deactivated and thus current increases very little in response to increasing voltage. While deactivated, current increases only about 2 orders of magnitude in response to about a 2 volt increase in voltage.

Following selector activation 402, the selector device enters a low selector resistance state. Here, current very rapidly increases with increasing voltage, and the memory device becomes the dominant resistance for the two-terminal memory cell. Thus, if the memory device is in a high memory resistance state (off cell 404) following selector activation 402, current increases about five and one half orders of magnitude in response to less than a tenth of a volt increase. If the memory device is in a low memory resistance state (on cell 406), current can increase as much as 9 orders of magnitude in less than a tenth of a volt.

Above about 2 volts, current stabilizes and increases relatively slowly with increasing voltage. Note that although the increase in current versus voltage is fairly similar for off cell 404 and on cell 406 between about 2 and less than 3 volts, absolute value of current can be between 3 and 4 orders of magnitude higher for on cell 406 compared with off cell 404, in one or more embodiments. At about 3 volts, off cell programming 408 can occur, changing the memory device from the off cell 404 to the on cell 406 (e.g., switching the memory device from the high memory resistance state to the low memory resistance state). Below this voltage, off cell programming 408 can be avoided.

As illustrates by FIG. 4, the two-terminal memory cell can have significantly different current responses to decreasing voltage for the off cell 414 and the on cell 412. Particularly, the selector device can begin to deactivate at just below the voltage associated with selector activation 402 (e.g., below about 2 volts), for the off cell 404 memory device. However, the selector device remains active below the voltage associated with selector activation 402 for the on cell 406 memory device. It is worth noting that the current response to decreasing voltage for on cell 412 and current response to decreasing voltage for off cell 414 can vary depending on selection of materials and layers for the two-terminal memory device (e.g., such as described at FIG. 3, supra). But a difference in the current response to decreasing voltage for the on cell 412 and off cell 414 is a common characteristic of disclosed two-terminal memory cells. This difference in current response to decreasing voltage enables a state of the memory device to be inferred from the deactivation, or lack thereof, of the selector device. As a result, the on/off current ratio of the selector device can be employed for sensing the state of the memory device, instead of the on/off current ratio of the memory device itself.

For negative voltages, the selector device can activate in response to the voltage exceeding a negative activation threshold. As depicted by FIG. 4, the negative activation threshold can be a different voltage magnitude than a positive activation threshold associated with selector activation 402. However, in at least some embodiments the negative activation threshold can be substantially similar to the positive activation threshold. Once the selector device activates, current increases with decreasing negative voltage, and the maximum current is determined by a state of the memory device. At an erase voltage 416, an on cell 406 memory device is erased to an off cell memory device, as depicted. Increasing negative voltage (back to zero) deactivates the selector device at the negative activation threshold, until the zero volts is again reached.

Figure 5:
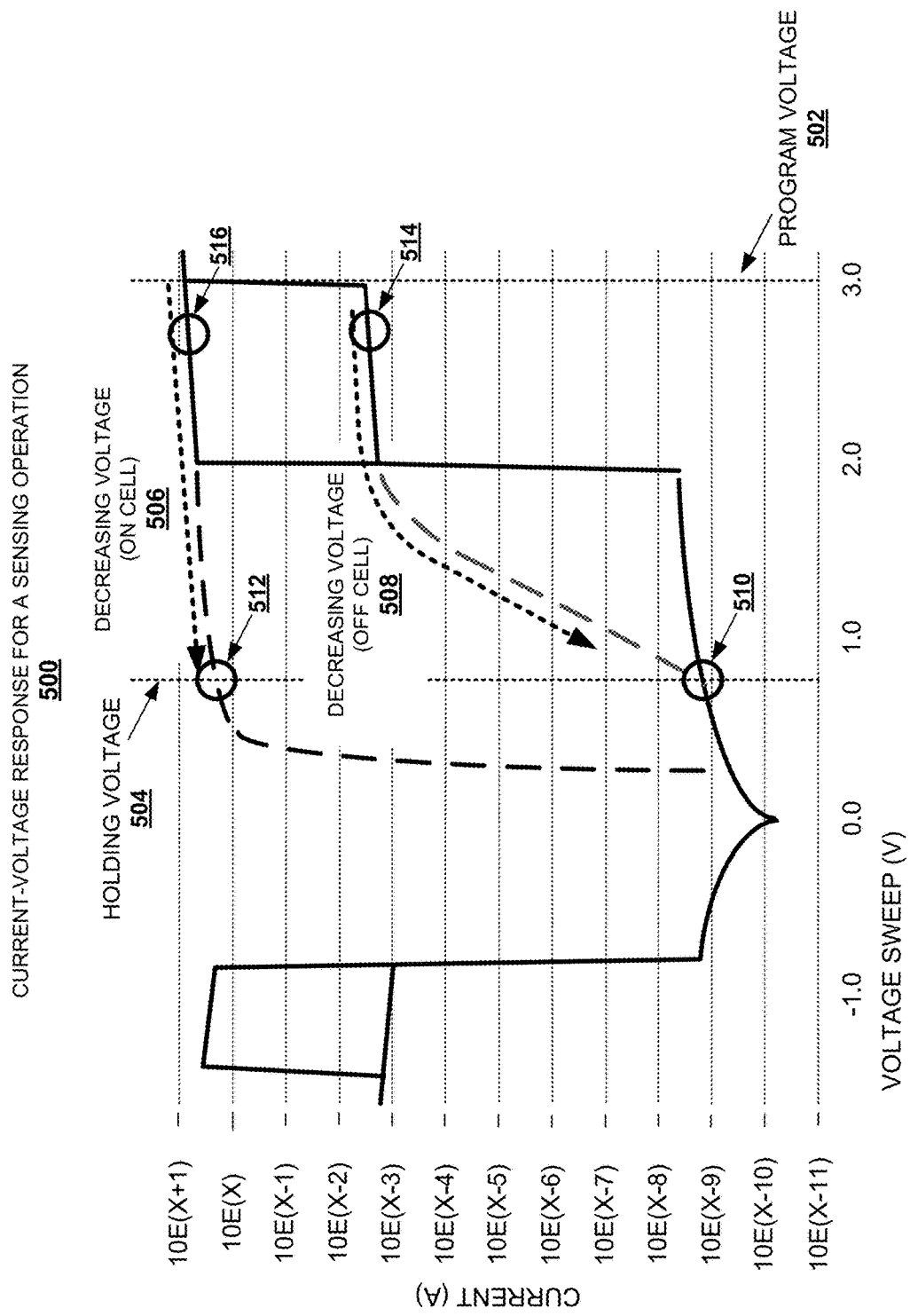
FIG. 5 illustrates a diagram of example holding characteristics of a selector device in conjunction with a non-volatile resistive memory, in an embodiment(s)

FIG. 5 depicts a diagram of an example current-voltage response 500 of a two-terminal memory device in response to disclosed sensing signals, according to further embodiments of the present disclosure. In some embodiments, current-voltage response 500 can correspond to sensing signals 200 of FIG. 2 and two-terminal memory device 300 of FIG. 3, supra. However, the subject disclosure is not limited to these embodiments.

Starting at zero volts, voltage can be increased. In some embodiments, the voltage is increased to a precharge voltage. The precharge voltage can be selected from a voltage between about 0.8 volts and about 2.0 volts, in various suitable embodiments. As a particular example, the precharge voltage can be about 1.4 volts. In alternative embodiments, the precharge voltage can be skipped, and voltage increased from zero volts to a selector device activation voltage. Upon reaching the selector device activation voltage, the selector device activates and current increases much more quickly with increasing voltage in comparison to before selector device activation.

Above the selector device activation voltage, and below a program voltage 502, an on/off current ratio of the two-terminal memory cell is determined by an on/off current ratio of the memory device. An off-state current 514 of the memory device above the activation voltage can be compared with an on-state current 516 for the memory device. The memory device on/off current ratio is just above three orders of magnitude. Sensing the two-terminal memory cell here would give about three orders of magnitude in sensing margin for the memory cell.

Decreasing voltage below the activation voltage results in one of two current responses: off cell response to decreasing voltage 508 and on cell response to decreasing voltage 506. As depicted, the on cell response 506 and off cell response 508 can diverge rapidly at voltages where the selector device of the off cell begins to deactivate yet the selector device of the on cell remains active. A holding voltage 504 can be selected within a range of voltages for which the off cell selector device has deactivated or at least begun deactivation (e.g., below the activation voltage, in some embodiments, or a range of voltages below the activation voltage in other embodiments). For the example depicted by FIG. 5, holding voltage 504 is selected at a voltage where off cell response 508 approaches (or merges with) the initial current-voltage response of the two-terminal memory cell prior to activation of the selector device. At this holding voltage 504, off-state selector current 510 is about 9 orders of magnitude smaller than on-state selector current 512. In at least some disclosed embodiments, the off-state selector current 510 can be as large as 12 orders of magnitude smaller than on-state selector current 512. It should be appreciated that holding voltage 504 can be selected at other voltage values less than a selector device deactivation voltage, and is not limited to the holding voltage 504 depicted by FIG. 5.

The aforementioned diagrams have been described with respect to interaction between several components (e.g., layers) of a memory cell, a layer thereof, or a memory architecture comprised of such memory cells/conductive layers. It should be appreciated that in some suitable alternative aspects of the subject disclosure, such diagrams can include those components and layers specified therein, some of the specified components/layers, or additional components/layers. Sub-components can also be implemented as electrically connected to other sub-components rather than included within a parent component/layer. For example, an intermediary layer(s) can be instituted adjacent to one or more of the disclosed layers. As one example, a suitable barrier layer that mitigates or controls unintended oxidation can be positioned between one or more disclosed layers. In yet other embodiments, a disclosed memory stack or set of film layers can have fewer layers than depicted. For instance, a switching layer can electrically contact a conductive wire directly, rather than having an electrode layer there between. Additionally, it is noted that one or more disclosed processes can be combined into a single process providing aggregate functionality. Components of the disclosed architectures can also interact with one or more other components not specifically described herein but known by those of skill in the art.

Figure 7:
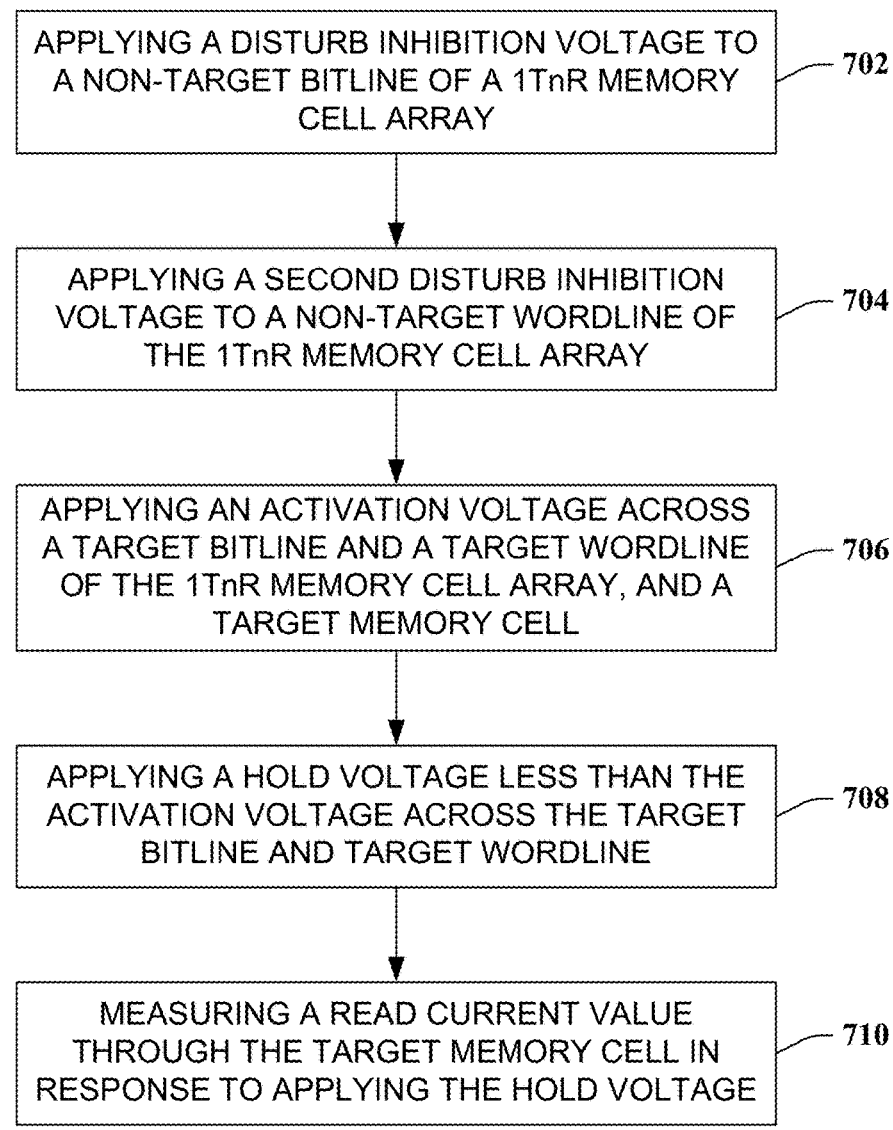
FIG. 7 depicts a flowchart of a sample method for sensing a 1TnR memory cell array according to additional embodiments.
Figure 8:
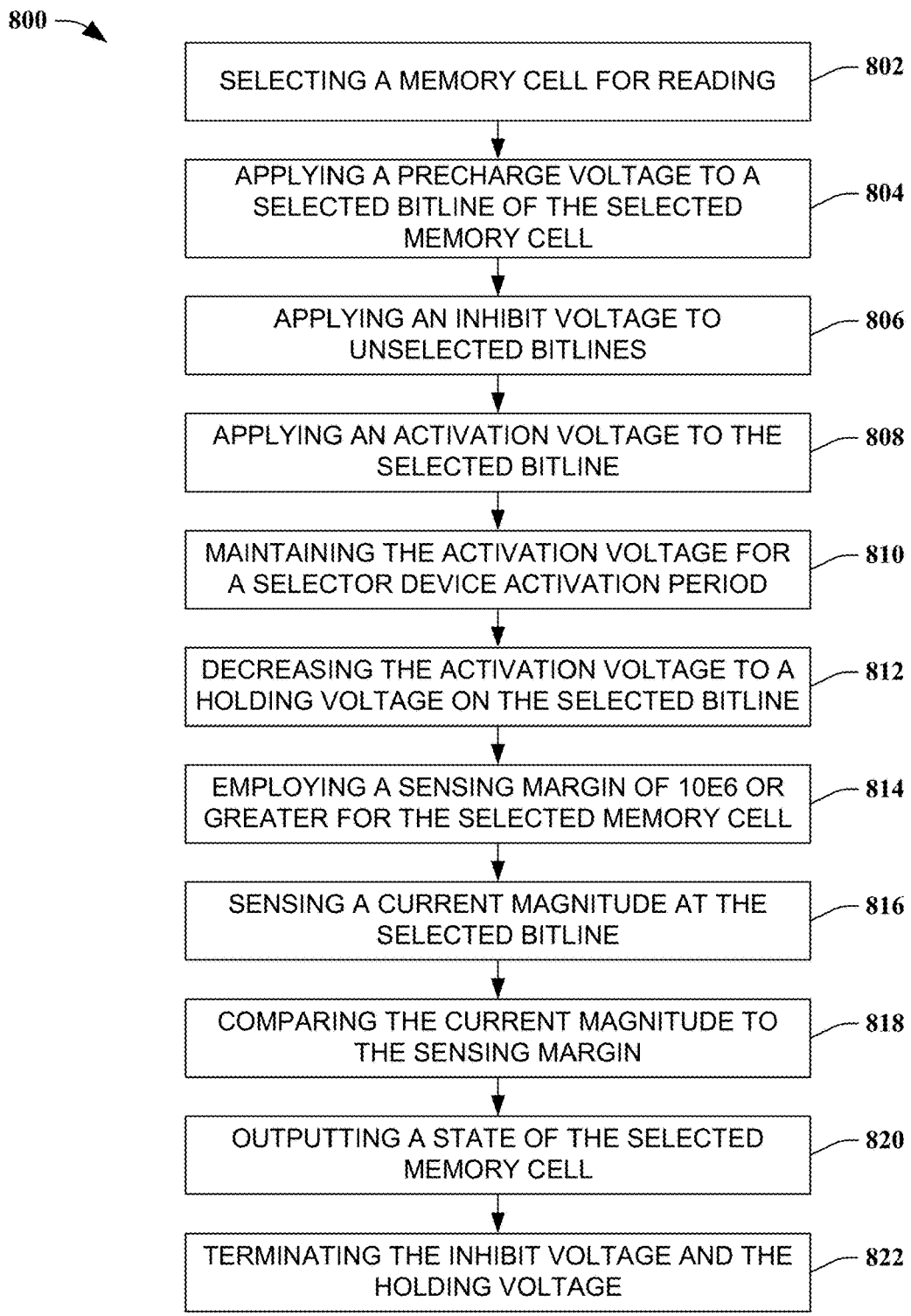
FIG. 8 illustrates a flowchart of a sample method for increasing sensing margin when sensing a 1TnR memory cell array according to other embodiments.

In view of the exemplary diagrams described supra, process methods that can be implemented in accordance with the disclosed subject matter will be better appreciated with reference to the flow charts of FIGS. 6-8. While for purposes of simplicity of explanation, the methods of FIGS. 6-8 are shown and described as a series of blocks, it is to be understood and appreciated that the claimed subject matter is not limited by the order of the blocks, as some blocks may occur in different orders or concurrently with other blocks from what is depicted and described herein. Moreover, not all illustrated blocks are necessarily required to implement the disclosed methods. Additionally, it should be further appreciated that some or all of the methods disclosed throughout this specification are capable of being stored on an article of manufacture to facilitate transporting and transferring such methodologies to an electronic device, or being integrated with an apparatus or electronic device (e.g., stored in erasable memory, stored in read only memory, implemented with programmable or non-programmable logic arrays, etc.), or partly stored on an article of manufacture and partly integrated with an apparatus or electronic device. The term article of manufacture, as used, is intended to encompass a computer program accessible from any computer-readable device, device in conjunction with a carrier, or storage medium.

FIG. 6 illustrates a flowchart of a sample method 600 for sensing a two-terminal memory cell according to various disclosed embodiments. In some embodiments, method 600 can comprise a method for sensing data stored in a resistive memory comprising a first electrode, a second electrode and a resistive switching medium in electrical series with a selection device disposed between the first electrode and the second electrode. At 602, method 600 can comprise applying a first voltage across the first electrode and the second electrode. For instance, the first voltage can have a magnitude larger than an activation magnitude of the selection device. In at least one embodiment, the first voltage can be selected from between about 2 volts and about 2.5 volts. Further, in response to the first voltage, the selection device can switch from a high selection resistance to a low selection resistance.

At 604, method 600 can comprise applying a second voltage between the first electrode and the second electrode. The second voltage can have a second magnitude below the activation magnitude of the selection device. In one or more embodiments, the second voltage can be from between about 0.5 volts and about 1.5 volts. At 606, method 600 can comprise measuring a value of a read current through the resistive switching medium in response to the second voltage. Generally, dropping the voltage below the activation magnitude of the selection device is conventionally presumed to deactivate the selection device, and thus measuring a read current would conventionally not be done in conjunction with a voltage below the activation magnitude of the selection device. For a selector device that deactivates partially in dependence on a state of an associated memory device, sensing the memory cell below the activation voltage can be utilized to determine a state of the memory cell, as described herein.

At 606, method 600 can comprise measuring a value of a read current through the resistive switching medium in response to the second voltage. Additionally, the method can comprise determining a resistive state of the resistive switching medium in response to the value of the read current. For instance, the resistive state can be determined to be a high memory resistance in response to the read current having a first read current value (e.g., below a threshold current), or the resistive state can be determined to be a low memory resistance in response to the read current having a second read current value (e.g., above the threshold current). In additional embodiments, a ratio of the first read current value to the second read current value can be within a range of about 10E3 to about 10E4.

In further embodiments, an on-off read current ratio of an on-state current value for the resistive switching medium in a conductive state, to an off-state current value for the resistive switching medium in a non-conductive state, is between about 10E2 and about 10E3.5 in response to applying the first voltage across the first electrode and the second electrode. Additionally, the on-of read current ratio of the on-state current value to the off-state current value can be between about 10E4.5 and about 10E9 in response to applying the second voltage across the first electrode and the second electrode.

In additional embodiments, method 600 can comprise applying a precharge voltage across the first electrode and the second electrode. The precharge voltage can have a third magnitude below the activation magnitude. The precharge voltage can be applied prior to the first voltage, in various embodiments. Further, applying the precharge voltage can cause an initial current through the resistive switching medium, wherein a ratio of a value of the initial current to the value of the read current can be within a range of about 10E6 to about 10E9. In an embodiment(s), the precharge voltage can be applied for a duration selected from about 50 ns to about 200 ns. According to alternative or additional embodiments, the first voltage can be applied for a duration selected from about 50 ns to about 200 ns.

FIG. 7 illustrates a flowchart of a sample method 700 for sensing an array of two-terminal memory cells according to one or more embodiments of the present disclosure. At 702, method 700 can comprise applying a disturb inhibition voltage to a non-target bitline of a 1TnR memory cell array. At 704, method 700 can comprise applying a second disturb inhibition voltage to a non-target wordline of the 1TnR memory cell array. In addition to the foregoing, at 706, method 700 can comprise applying an activation voltage across a target bitline and a target wordline of the 1TnR resistive memory cell array, where the target bitline and target wordline are respectively connected to a target memory cell. At 708, method 700 can comprise applying a hold voltage across the target bitline and the target wordline, wherein the hold voltage has a magnitude less than the activation voltage. As one example of the foregoing activation and hold voltages, the hold voltage can be within a range from about 0.5 volts to about 2.0 volts, and the activation voltage can be in a range from about 2.0 volts to about 3.0 volts. Other suitable ranges can be employed in other embodiments. At 710, method 700 can comprise measuring a read current value through the target memory cell in response to applying the hold voltage.

In one or more embodiments, applying the activation voltage can comprise applying a voltage within a range of about 2 volts to about 3 volts. Additionally, applying the hold voltage can comprise applying a voltage within a range of about 0.5 volts and about 2 volts. In some embodiments, applying the hold voltage can comprise decreasing the activation voltage from a first of about 2.2 volts to about 2.6 volts, to a second range of about 0.5 volts to about 1.5 volts.

In further embodiments, applying the disturb inhibition voltage or the second disturb inhibition voltage can comprise applying a voltage within a range of about 1 volt to about 2 volts. In a further embodiment, method 700 can additionally comprise applying a precharge voltage across the target bitline and the target wordline prior to applying the activation voltage. In another embodiment, method 700 can comprise maintaining the precharge voltage for a period between about 50 ns and about 200 ns. Additionally, the precharge voltage can be maintained for a period between about 50 ns and about 200 ns. In one or more additional embodiments, method 700 can comprise employing a sensing margin of 10E6 or greater for measuring the read current value in response to applying the hold voltage.

FIG. 8 illustrates a flowchart of a sample method 800 for sensing a memory array according to still other embodiments of the present disclosure. At 802, method 800 can comprise selecting a memory cell for reading, and at 804, method 800 can comprise applying a precharge voltage to a selected bitline of the selected memory cell. Additionally, at 806 method 800 can comprise applying an inhibit voltage to unselected bitlines of the memory array.

At 808, method 800 can comprise applying an activation voltage to the selected bitline, and at 810 can comprise maintaining the activation voltage for a selector device activation period. At 812, method 800 can comprise decreasing the activation voltage to a holding voltage on the selected bitline. At 814, method 800 can comprise employing a sensing margin of 10E6 or greater for the selected memory cell.

At 816, method 800 can comprise sensing a current magnitude at the selected bitline. At 818, method 800 can additionally comprise comparing the current magnitude to the sensing margin and, at 820, method 800 can comprise outputting a state of the selected memory cell in response to the comparing. At 822, method 800 can end by terminating the inhibit voltage and the holding voltage.

In various embodiments of the subject disclosure, disclosed memory architectures can be employed as a stand-alone or integrated embedded memory device with a CPU or microcomputer. Some embodiments can be implemented, for instance, as part of a computer memory (e.g., random access memory, cache memory, read-only memory, storage memory, or the like). Other embodiments can be implemented, for instance, as a portable memory device. Examples of suitable portable memory devices can include removable memory, such as a secure digital (SD) card, a universal serial bus (USB) memory stick, a compact flash (CF) card, or the like, or suitable combinations of the foregoing. (See, e.g., FIGS. 9 and 10, infra).

NAND FLASH is employed for compact FLASH devices, USB devices, SD cards, solid state drives (SSDs), and storage class memory, as well as other form-factors. Although NAND has proven a successful technology in fueling the drive to scale down to smaller devices and higher chip densities over the past decade, as technology scaled down past 25 nanometer (nm) memory cell technology, the inventors have identified several structural, performance, and reliability problems that became evident to them. One or more of these considerations or similar considerations can be addressed by some or all of the disclosed aspects.

Figure 9:
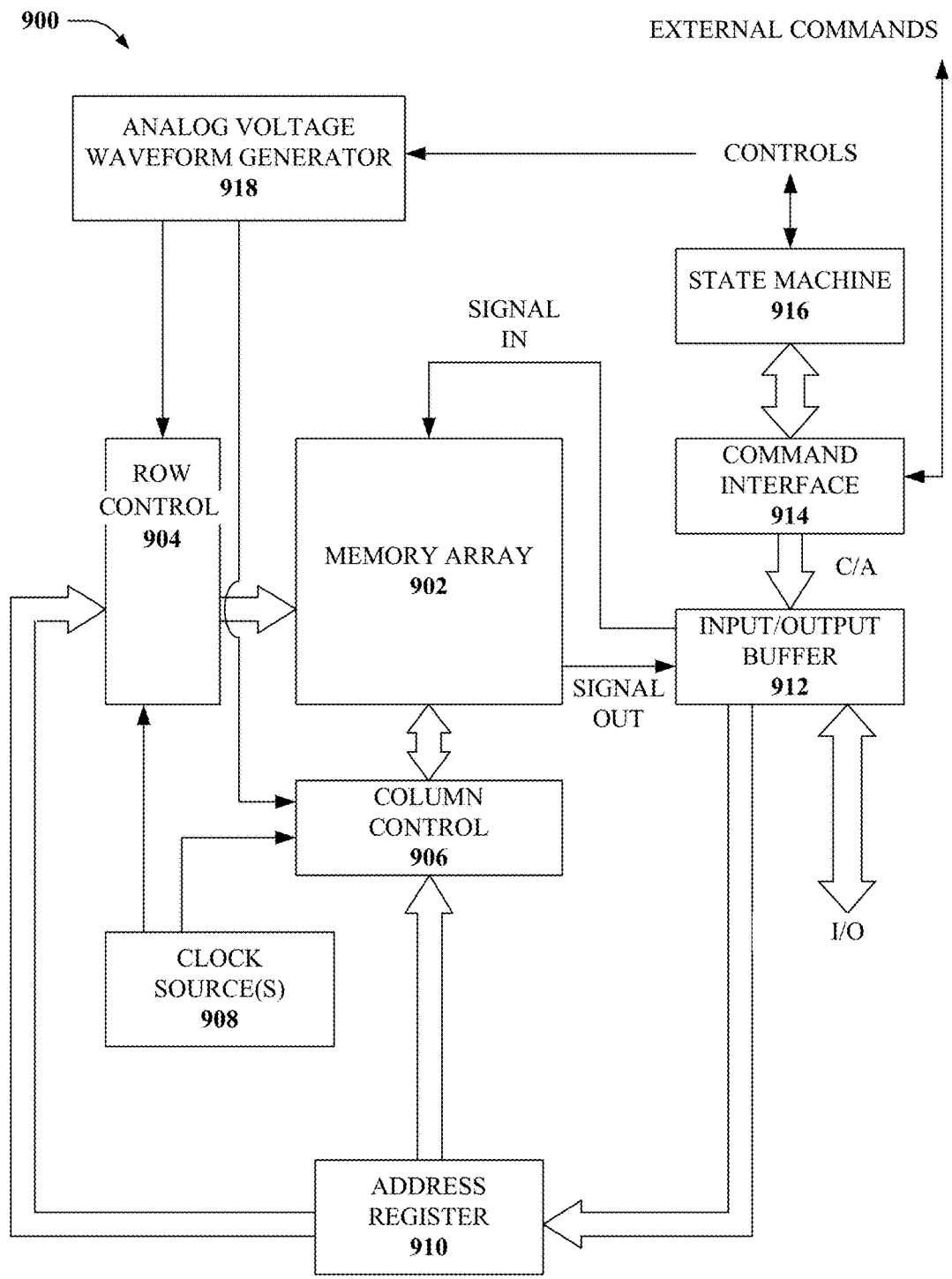
FIG. 9 depicts a block diagram of an example operating and control environment for a memory device according to disclosed embodiments.

In order to provide a context for the various aspects of the disclosed subject matter, FIG. 9, as well as the following discussion, is intended to provide a brief, general description of a suitable environment in which various aspects of the disclosed subject matter can be implemented or processed. While the subject matter has been described above in the general context of electronic memory and process methods for fabricating or operating the electronic memory, those skilled in the art will recognize that the subject disclosure also can be implemented in combination with other components/layers of memory, memory architectures or process methodologies. Moreover, those skilled in the art will appreciate that the disclosed processes can be implemented within a processing system or a computer processor, either alone or in conjunction with a host computer, which can include single-processor or multiprocessor computer systems, mini-computing devices, mainframe computers, as well as personal computers, hand-held computing devices (e.g., PDA, smart phone, watch), microprocessor-based or programmable consumer or industrial electronics, and the like. The illustrated aspects may also be practiced in distributed computing environments where tasks are performed by remote processing devices that are linked through a communications network. However, some, if not all aspects of the claimed innovation can be practiced on stand-alone electronic devices, such as a memory card, FLASH memory module, removable memory, or the like. In a distributed computing environment, program modules can be located in both local and remote memory storage modules or devices.

In one or more embodiments of the present disclosure, two appendices including Appendix A and Appendix B, filed concurrently with this Specification, are incorporated by reference herein in their respective entireties and for all purposes.

FIG. 9 illustrates a block diagram of an example operating and control environment 900 for a memory cell array 902 according to aspects of the subject disclosure. In at least one aspect of the subject disclosure, memory cell array 902 can comprise a variety of memory cell technology. Particularly, memory cell array 902 can comprise two-terminal memory such as resistive memory cells with a non-volatile memory device and a volatile selector device, as described herein.

A column controller 906 can be formed adjacent to memory cell array 902. Moreover, column controller 906 can be electrically coupled with bit lines of memory cell array 902. Column controller 906 can control respective bitlines, applying suitable program, erase or read voltages to selected bitlines.

In addition, operating and control environment 900 can comprise a row controller 904. Row controller 904 can be formed adjacent to column controller 906, and electrically connected with word lines of memory cell array 902. Row controller 904 can select particular rows of memory cells with a suitable selection voltage. Moreover, row controller 904 can facilitate program, erase or read operations by applying suitable voltages at selected word lines.

A clock source(s) 908 can provide respective clock pulses to facilitate timing for read, write, and program operations of row control 904 and column control 906. Clock source(s) 908 can further facilitate selection of word lines or bit lines in response to external or internal commands received by operating and control environment 900. An input/output buffer 912 can be connected to an external host apparatus, such as a computer or other processing device (not depicted) by way of an I/O buffer or other I/O communication interface. Input/output buffer 912 can be configured to receive write data, receive an erase instruction, output readout data, and receive address data and command data, as well as address data for respective instructions. Address data can be transferred to row controller 904 and column controller 906 by an address register 910. In addition, input data is transmitted to memory cell array 902 via signal input lines, and output data is received from memory cell array 902 via signal output lines. Input data can be received from the host apparatus, and output data can be delivered to the host apparatus via the I/O buffer.

Commands received from the host apparatus can be provided to a command interface 914. Command interface 914 can be configured to receive external control signals from the host apparatus, and determine whether data input to the input/output buffer 912 is write data, a command, or an address. Input commands can be transferred to a state machine 916.

State machine 916 can be configured to manage programming and reprogramming of memory cell array 902. State machine 916 receives commands from the host apparatus via input/output interface 912 and command interface 914, and manages read, write, erase, data input, data output, and like functionality associated with memory cell array 902. In some aspects, state machine 916 can send and receive acknowledgments and negative acknowledgments regarding successful receipt or execution of various commands.

In an embodiment, state machine 916 can control an analog voltage waveform generator 918 that provides read/write and program/erase signals to row control 904 and column control 906.

To implement read, write, erase, input, output, etc., functionality, state machine 916 can control clock source(s) 908. Control of clock source(s) 908 can cause output pulses configured to facilitate row controller 904 and column controller 906 implementing the particular functionality. Output pulses can be transferred to selected bit lines by column controller 906, for instance, or word lines by row controller 904, for instance.

The illustrated aspects of the disclosure may also be practiced in distributed computing environments where certain tasks are performed by remote processing devices that are linked through a communications network. In a distributed computing environment, program modules or stored information, instructions, or the like can be located in local or remote memory storage devices.

Moreover, it is to be appreciated that various components described herein can include electrical circuit(s) that can include components and circuitry elements of suitable value in order to implement the embodiments of the subject innovation(s). Furthermore, it can be appreciated that many of the various components can be implemented on one or more IC chips. For example, in one embodiment, a set of components can be implemented in a single IC chip. In other embodiments, one or more respective components are fabricated or implemented on separate IC chips.

In connection with FIG. 10, the systems and processes described below can be embodied within hardware, such as a single integrated circuit (IC) chip, multiple ICs, an application specific integrated circuit (ASIC), or the like. Further, the order in which some or all of the process blocks appear in each process should not be deemed limiting. Rather, it should be understood that some of the process blocks can be executed in a variety of orders, not all of which may be explicitly illustrated herein.

Figure 10:
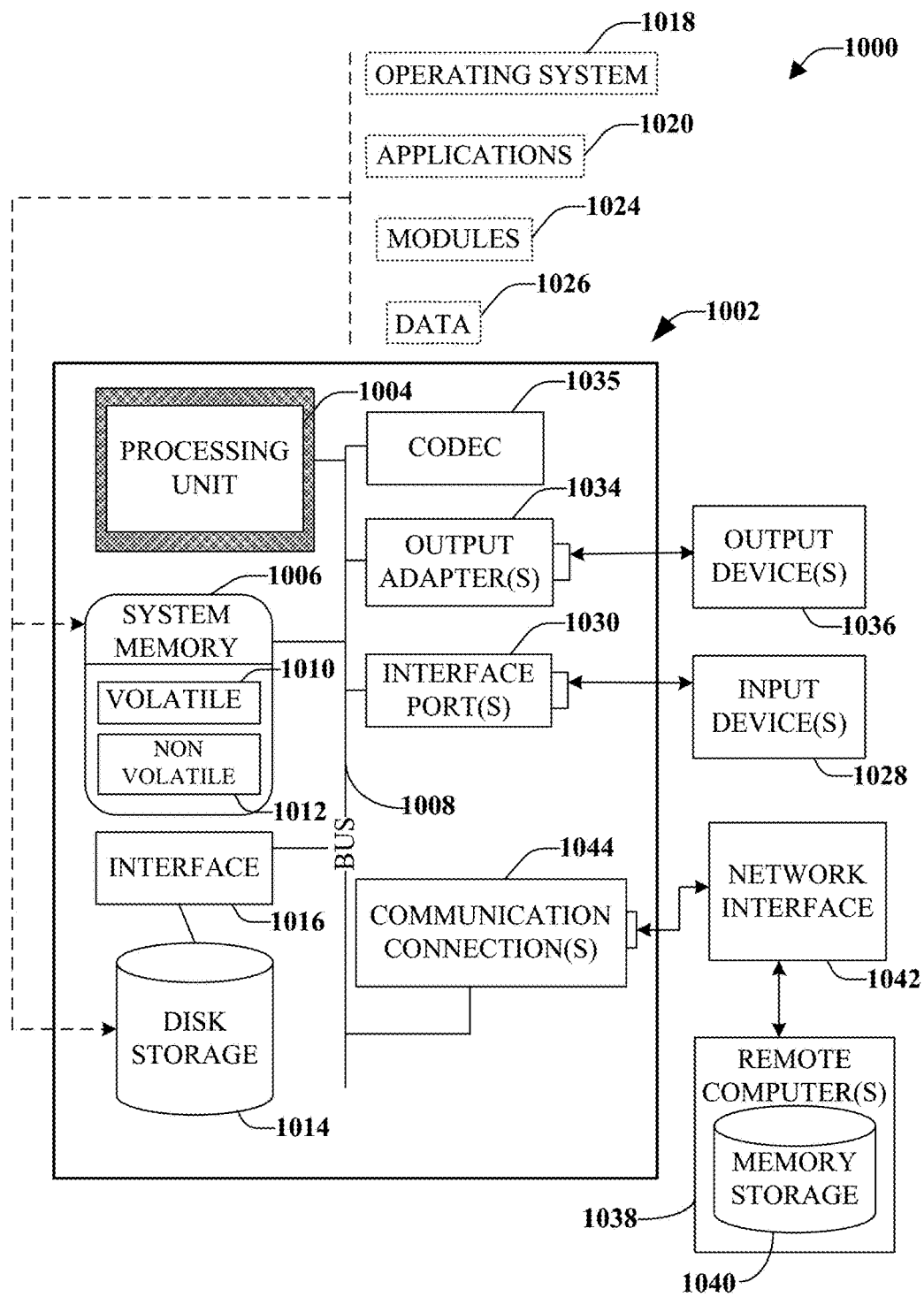
FIG. 10 illustrates a block diagram of an example computing environment that can be implemented in conjunction with various embodiments.

With reference to FIG. 10, a suitable environment 1000 for implementing various aspects of the claimed subject matter includes a computer 1002. The computer 1002 includes a processing unit 1004, a system memory 1006, a codec 1035, and a system bus 1008. The system bus 1008 couples system components including, but not limited to, the system memory 1006 to the processing unit 1004. The processing unit 1004 can be any of various available processors. Dual microprocessors and other multiprocessor architectures also can be employed as the processing unit 1004.

The system bus 1008 can be any of several types of bus structure(s) including the memory bus or memory controller, a peripheral bus or external bus, or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Personal Computer Memory Card International Association bus (PCMCIA), Firewire (IEEE 1394), and Small Computer Systems Interface (SCSI).

The system memory 1006 includes volatile memory 1010 and non-volatile memory 1012, which can employ one or more of the disclosed memory architectures, in various embodiments. The basic input/output system (BIOS), containing the basic routines to transfer information between elements within the computer 1002, such as during start-up, is stored in non-volatile memory 1012. In addition, according to present innovations, codec 1035 may include at least one of an encoder or decoder, wherein the at least one of an encoder or decoder may consist of hardware, software, or a combination of hardware and software. Although, codec 1035 is depicted as a separate component, codec 1035 may be contained within non-volatile memory 1012. By way of illustration, and not limitation, non-volatile memory 1012 can include read only memory (ROM), programmable ROM (PROM), electrically programmable ROM (EPROM), electrically erasable programmable ROM (EEPROM), or Flash memory. Non-volatile memory 1012 can employ one or more of the disclosed memory devices, in at least some embodiments. Moreover, non-volatile memory 1012 can be computer memory (e.g., physically integrated with computer 1002 or a mainboard thereof), or removable memory. Examples of suitable removable memory with which disclosed embodiments can be implemented can include a secure digital (SD) card, a compact Flash (CF) card, a universal serial bus (USB) memory stick, or the like. Volatile memory 1010 includes random access memory (RAM), which acts as external cache memory, and can also employ one or more disclosed memory devices in various embodiments. By way of illustration and not limitation, RAM is available in many forms such as static RAM (SRAM), dynamic RAM (DRAM), synchronous DRAM (SDRAM), double data rate SDRAM (DDR SDRAM), and enhanced SDRAM (ESDRAM) and so forth.

Computer 1002 may also include removable/non-removable, volatile/non-volatile computer storage medium. FIG. 10 illustrates, for example, disk storage 1014. Disk storage 1014 includes, but is not limited to, devices like a magnetic disk drive, solid state disk (SSD) floppy disk drive, tape drive, Jaz drive, Zip drive, LS-100 drive, flash memory card, or memory stick. In addition, disk storage 1014 can include storage medium separately or in combination with other storage medium including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage devices 1014 to the system bus 1008, a removable or non-removable interface is typically used, such as interface 1016. It is appreciated that storage devices 1014 can store information related to a user. Such information might be stored at or provided to a server or to an application running on a user device. In one embodiment, the user can be notified (e.g., by way of output device(s) 1036) of the types of information that are stored to disk storage 1014 or transmitted to the server or application. The user can be provided the opportunity to opt-in or opt-out of having such information collected or shared with the server or application (e.g., by way of input from input device(s) 1028).

It is to be appreciated that FIG. 10 describes software that acts as an intermediary between users and the basic computer resources described in the suitable operating environment 1000. Such software includes an operating system 1018. Operating system 1018, which can be stored on disk storage 1014, acts to control and allocate resources of the computer system 1002. Applications 1020 take advantage of the management of resources by operating system 1018 through program modules 1024, and program data 1026, such as the boot/shutdown transaction table and the like, stored either in system memory 1006 or on disk storage 1014. It is to be appreciated that the claimed subject matter can be implemented with various operating systems or combinations of operating systems.

A user enters commands or information into the computer 1002 through input device(s) 1028. Input devices 1028 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 1004 through the system bus 1008 via interface port(s) 1030. Interface port(s) 1030 include, for example, a serial port, a parallel port, a game port, and a universal serial bus (USB). Output device(s) 1036 use some of the same type of ports as input device(s) 1028. Thus, for example, a USB port may be used to provide input to computer 1002 and to output information from computer 1002 to an output device 1036. Output adapter 1034 is provided to illustrate that there are some output devices 1036 like monitors, speakers, and printers, among other output devices 1036, which require special adapters. The output adapters 1034 include, by way of illustration and not limitation, video and sound cards that provide a means of connection between the output device 1036 and the system bus 1008. It should be noted that other devices or systems of devices provide both input and output capabilities such as remote computer(s) 1038.

Computer 1002 can operate in a networked environment using logical connections to one or more remote computers, such as remote computer(s) 1038. The remote computer(s) 1038 can be a personal computer, a server, a router, a network PC, a workstation, a microprocessor based appliance, a peer device, a smart phone, a tablet, or other network node, and typically includes many of the elements described relative to computer 1002. For purposes of brevity, only a memory storage device 1040 is illustrated with remote computer(s) 1038. Remote computer(s) 1038 is logically connected to computer 1002 through a network interface 1042 and then connected via communication connection(s) 1044. Network interface 1042 encompasses wire or wireless communication networks such as local-area networks (LAN) and wide-area networks (WAN) and cellular networks. LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL).

Communication connection(s) 1044 refers to the hardware/software employed to connect the network interface 1042 to the bus 1008. While communication connection 1044 is shown for illustrative clarity inside computer 1002, it can also be external to computer 1002. The hardware/software necessary for connection to the network interface 1042 includes, for exemplary purposes only, internal and external technologies such as, modems including regular telephone grade modems, cable modems and DSL modems, ISDN adapters, and wired and wireless Ethernet cards, hubs, and routers.

As utilized herein, terms "component," "system," "architecture" and the like are intended to refer to a computer or electronic-related entity, either hardware, a combination of hardware and software, software (e.g., in execution), or firmware. For example, a component can be one or more transistors, a memory cell, an arrangement of transistors or memory cells, a gate array, a programmable gate array, an application specific integrated circuit, a controller, a processor, a process running on the processor, an object, executable, program or application accessing or interfacing with semiconductor memory, a computer, or the like, or a suitable combination thereof. The component can include erasable programming (e.g., process instructions at least in part stored in erasable memory) or hard programming (e.g., process instructions burned into non-erasable memory at manufacture).

By way of illustration, both a process executed from memory and the processor can be a component. As another example, an architecture can include an arrangement of electronic hardware (e.g., parallel or serial transistors), processing instructions and a processor, which implement the processing instructions in a manner suitable to the arrangement of electronic hardware. In addition, an architecture can include a single component (e.g., a transistor, a gate array, . . . ) or an arrangement of components (e.g., a series or parallel arrangement of transistors, a gate array connected with program circuitry, power leads, electrical ground, input signal lines and output signal lines, and so on). A system can include one or more components as well as one or more architectures. One example system can include a switching block architecture comprising crossed input/output lines and pass gate transistors, as well as power source(s), signal generator(s), communication bus(ses), controllers, I/O interface, address registers, and so on. It is to be appreciated that some overlap in definitions is anticipated, and an architecture or a system can be a stand-alone component, or a component of another architecture, system, etc.

In addition to the foregoing, the disclosed subject matter can be implemented as a method, apparatus, or article of manufacture using typical manufacturing, programming or engineering techniques to produce hardware, firmware, software, or any suitable combination thereof to control an electronic device to implement the disclosed subject matter. The terms "apparatus" and "article of manufacture" where used herein are intended to encompass an electronic device, a semiconductor device, a computer, or a computer program accessible from any computer-readable device, carrier, or media. Computer-readable media can include hardware media, or software media. In addition, the media can include non-transitory media, or transport media. In one example, non-transitory media can include computer readable hardware media. Specific examples of computer readable hardware media can include but are not limited to magnetic storage devices (e.g., hard disk, floppy disk, magnetic strips . . . ), optical disks (e.g., compact disk (CD), digital versatile disk (DVD) . . . ), smart cards, and flash memory devices (e.g., card, stick, key drive . . . ). Computer-readable transport media can include carrier waves, or the like. Of course, those skilled in the art will recognize many modifications can be made to this configuration without departing from the scope or spirit of the disclosed subject matter.

What has been described above includes examples of the subject innovation. It is, of course, not possible to describe every conceivable combination of components or methodologies for purposes of describing the subject innovation, but one of ordinary skill in the art can recognize that many further combinations and permutations of the subject innovation are possible. Accordingly, the disclosed subject matter is intended to embrace all such alterations, modifications and variations that fall within the spirit and scope of the disclosure. Furthermore, to the extent that a term "includes", "including", "has" or "having" and variants thereof is used in either the detailed description or the claims, such term is intended to be inclusive in a manner similar to the term "comprising" as "comprising" is interpreted when employed as a transitional word in a claim.

Moreover, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

Additionally, some portions of the detailed description have been presented in terms of algorithms or process operations on data bits within electronic memory. These process descriptions or representations are mechanisms employed by those cognizant in the art to effectively convey the substance of their work to others equally skilled. A process is here, generally, conceived to be a self-consistent sequence of acts leading to a desired result. The acts are those requiring physical manipulations of physical quantities. Typically, though not necessarily, these quantities take the form of electrical or magnetic signals capable of being stored, transferred, combined, compared, and/or otherwise manipulated.

It has proven convenient, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities. Unless specifically stated otherwise or apparent from the foregoing discussion, it is appreciated that throughout the disclosed subject matter, discussions utilizing terms such as processing, computing, replicating, mimicking, determining, or transmitting, and the like, refer to the action and processes of processing systems, and/or similar consumer or industrial electronic devices or machines, that manipulate or transform data or signals represented as physical (electrical or electronic) quantities within the circuits, registers or memories of the electronic device(s), into other data or signals similarly represented as physical quantities within the machine or computer system memories or registers or other such information storage, transmission and/or display devices.

In regard to the various functions performed by the above described components, architectures, circuits, processes and the like, the terms (including a reference to a "means") used to describe such components are intended to correspond, unless otherwise indicated, to any component which performs the specified function of the described component (e.g., a functional equivalent), even though not structurally equivalent to the disclosed structure, which performs the function in the herein illustrated exemplary aspects of the embodiments. In addition, while a particular feature may have been disclosed with respect to only one of several implementations, such feature may be combined with one or more other features of the other implementations as may be desired and advantageous for any given or particular application. It will also be recognized that the embodiments include a system as well as a computer-readable medium having computer-executable instructions for performing the acts and/or events of the various processes.

What is claimed is:

1. A method for operating a memory cell comprising a two-terminal non-volatile memory device in electrical series with a filamentary volatile resistive switching device, comprising:
   applying a first voltage magnitude to the memory cell, wherein the first voltage magnitude is selected to cause the filamentary volatile resistive switching device to enter a low resistance state;
   applying a second, non-zero voltage magnitude to the memory cell smaller than the first voltage magnitude and lower than an activation threshold voltage of the filamentary volatile resistive switching device; and
   sensing a data value stored by the two-terminal non-volatile memory device in response to applying the second, non-zero voltage magnitude.

2. The method of claim 1, further comprising applying the first voltage magnitude with a first polarity, wherein in response to applying the first voltage magnitude with the first polarity, a metal filament is formed from a first electrode of the filamentary volatile resistive switching device through a switching medium thereof to a second electrode of the filamentary volatile resistive switching device, facilitating the causing of the filamentary volatile resistive switching device to enter the low resistance state.

3. The method of claim 2, further comprising:
   reducing the second, non-zero voltage magnitude to zero volts and causing the filamentary volatile resistive switching device to enter a high resistance state from the low resistance state; and
   applying a third voltage with a second polarity, opposite the first polarity, wherein in response to applying the third voltage with the second polarity, a second metal filament is formed from the second electrode of the filamentary volatile resistive switching device through the switching medium thereof to the first electrode of the filamentary volatile resistive switching device, facilitating the causing of the filamentary volatile resistive switching device to enter the low resistance state or a second low resistance state.

4. The method of claim 1, further comprising selecting the second, non-zero voltage magnitude to maintain the low resistance state of the filamentary volatile resistive switching device in response to a first current conducted by the two-terminal non-volatile memory device in a low resistance memory state being greater than a first current threshold.

5. The method of claim 4, wherein the second, non-zero voltage magnitude is further selected to revert the filamentary volatile resistive switching device to a high resistance state in response to a second current conducted by the two-terminal non-volatile memory device in a high resistance memory state being lower than a second current threshold.

6. The method of claim 5, wherein sensing the data value further comprises determining whether a current through the memory cell is greater than the first current threshold or lower than the second current threshold.

7. The method of claim 5, wherein a ratio of the first current threshold and the second current threshold is about four orders of magnitude or greater.

8. The method of claim 1, further comprising:
applying the first voltage magnitude to the memory cell and causing the filamentary volatile resistive switching device to enter the low resistance state; and
applying a third voltage magnitude to the memory cell, wherein the third voltage magnitude is selected to cause the two-terminal non-volatile memory device to transition to a low resistance memory state, wherein the third voltage magnitude is larger than the first voltage magnitude.

9. The method of claim 1, further comprising:
applying a third voltage magnitude to the memory cell, having opposite polarity from the first voltage magnitude, and causing the filamentary volatile resistive switching device to enter a second low resistance state; and
applying a fourth voltage magnitude, of the opposite polarity from the first voltage magnitude, selected to cause the two-terminal non-volatile memory device to transition to a high resistance memory state, wherein the fourth voltage magnitude is larger than the third voltage magnitude.

10. The method of claim 1, further comprising selecting the second, non-zero voltage magnitude from a range between about 0.5 volts and about 1.5 volts.

11. The method of claim 10, further comprising selecting the second, non-zero voltage magnitude from a second range between about 0.6 volts and about 0.9 volts.

12. The method of claim 1, further comprising applying a precharge voltage across the memory cell prior to application of the first voltage magnitude and having a third voltage magnitude smaller than the first voltage magnitude.

13. A method for reading a resistive memory cell in a one-transistor, multiple resistive memory cell (1TnR) array of resistive memory, wherein the resistive memory cell comprises a two-terminal non-volatile device in electrical series with a filamentary selector device, the method comprising:
applying an activation voltage to a target bitline connected to the resistive memory cell, the activation voltage having a magnitude selected to cause a conductive metal filament to form in the filamentary selector device and to transition from a high resistance state to a low resistance state;
reducing the activation voltage to a hold voltage selected to maintain the conductive metal filament in the filamentary selector device in response to the two-terminal non-volatile device conducting a first current in response to the hold voltage, and to deform the conductive metal filament in the filamentary selector device in response to the two-terminal non-volatile device conducting a second current in response to the hold voltage, wherein the second current is smaller than the first current; and
determining a data value stored by the two-terminal non-volatile device from the first current or the second current.

14. The method of claim 13, further comprising applying an inhibition voltage to an adjacent bitline connected to a second resistive memory cell of the 1TnR array, prior to applying the activation voltage.

15. The method of claim 14, further comprising applying a precharge voltage to the target bitline in conjunction with applying the inhibition voltage to the adjacent bitline.

16. The method of claim 15, further comprising selecting a voltage within a range of about 1 volts to about 2 volts for the inhibition voltage or for the precharge voltage.

17. The method of claim 13, wherein determining the data value stored by the two-terminal non-volatile device further comprises:
measuring a current value conducted by the resistive memory cell; and
determining the two-terminal non-volatile device to be in a program state in response to the current value being equal to or larger than the first current and determining the two-terminal non-volatile device to be in an erase state in response to the current value being equal to or less than the second current.

18. The method of claim 13, further comprising:
applying the activation voltage to the target bitline; and
applying a program voltage to the target bitline, wherein the program voltage is selected to cause the two-terminal non-volatile device to transition to a low resistance memory state, wherein the program voltage is larger in magnitude than the activation voltage.

19. The method of claim 13, further comprising:
applying a second activation voltage to the target bitline, having opposite polarity from the activation voltage, and causing the filamentary selector device to enter a second low resistance state; and
applying an erase voltage, of the opposite polarity from the activation voltage, selected to cause the two-terminal non-volatile device to transition to a high resistance memory state, wherein the erase voltage is larger in magnitude than the second activation voltage.

20. The method of claim 13, wherein the hold voltage is selected from a range from about 0.6 volts to about 0.9 volts.

* * * * *